(12) United States Patent
Mori

(10) Patent No.: US 10,453,958 B2
(45) Date of Patent: Oct. 22, 2019

(54) SEMICONDUCTOR DEVICE AND MANUFACTURING METHOD FOR SEMICONDUCTOR DEVICE

(71) Applicant: Renesas Electronics Corporation, Tokyo (JP)

(72) Inventor: Takahiro Mori, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/059,855

(22) Filed: Aug. 9, 2018

(65) Prior Publication Data

US 2019/0067476 A1 Feb. 28, 2019

(30) Foreign Application Priority Data

Aug. 30, 2017 (JP) ................. 2017-165393

(51) Int. Cl.
*H01L 29/66* (2006.01)
*H01L 29/78* (2006.01)
*H01L 29/06* (2006.01)

(52) U.S. Cl.
CPC ...... *H01L 29/7835* (2013.01); *H01L 29/0653* (2013.01); *H01L 29/66704* (2013.01); *H01L 29/7825* (2013.01); *H01L 29/7846* (2013.01)

(58) Field of Classification Search
CPC ............ H01L 29/7825; H01L 29/7835; H01L 29/66704
See application file for complete search history.

(56) References Cited

U.S. PATENT DOCUMENTS

2010/0314670 A1 12/2010 Denison et al.
2016/0111488 A1* 4/2016 Lu ....................... H01L 29/7825
257/330

* cited by examiner

*Primary Examiner* — Trang Q Tran
(74) *Attorney, Agent, or Firm* — McGinn IP Law Group, PLLC.

(57) ABSTRACT

A semiconductor device includes a semiconductor substrate having a first surface and a second surface, a first insulation isolation film in which a first trench is formed and a conductive film having a gate electrode, a first buried part buried in the first trench and a first cap part located on the first buried part. The semiconductor substrate has a source region, a drain region, a drift region and a body region. The gate electrode faces the body region which is sandwiched between the drift region and the source region while being insulated from the body region. The first cap part projects longer than the first buried part in a channel width direction which is a direction along a boundary between the body region and the drift region in a planar view on the first insulation isolation film.

9 Claims, 18 Drawing Sheets

SEMICONDUCTOR DEVICE AND MANUFACTURING METHOD FOR SEMICONDUCTOR DEVICE

CROSS-REFERENCE TO RELATED APPLICATIONS

The disclosure of Japanese Patent Application No. 2017-165393 filed on Aug. 30, 2017 including the specification, drawings and abstract is incorporated herein by reference in its entirety.

BACKGROUND

The present invention relates to a semiconductor device and a manufacturing method for the semiconductor device.

At present, as a structure of an LDMOS (Laterally Diffused Metal Oxide Semiconductor) transistor for improving an off-state breakdown voltage, a structure described in US Patent Application Publication No. 2010/0314670 is known.

The LDMOS transistor described in US Patent Application Publication No. 2010/0314670 has a semiconductor substrate, an insulating film, a polycrystalline silicon film and a gate electrode. The semiconductor substrate has a first surface and a second surface. A trench which extends toward the second surface is formed in the first surface of the semiconductor substrate. The semiconductor substrate has an n-type source region which is arranged in the first surface, an n-type drain region which is arranged in the first surface separately from the source region, an n-type drift region which is arranged in the first surface so as to surround the drain region and a p-type channel region which is arranged in the first surface so as to be sandwiched between the drain region and the source region.

The insulating film is arranged on sidewalls and a bottom wall of the trench. The polycrystalline silicon film is arranged on the insulating film so as to fill the trench. The gate electrode faces the channel region while being insulated from the channel region.

SUMMARY

In a case where the LDMOS transistor described in US Patent Application Publication No. 2010/0314670 is in a gate off state, the drift region is inversely biased relative to the polycrystalline silicon film and therefore the drift region which is located around the polycrystalline silicon film is depleted. Therefore, in the LDMOS transistor described in US Patent Application Publication No. 2010/0314670, an off-state breakdown voltage is improved.

However, an upper surface of the polycrystalline silicon film is not formed into a shape of projecting toward the drift region which is located around the polycrystalline silicon film. Therefore, in the LDMOS transistor described in US Patent Application Publication No. 2010/0314670, it is difficult to deplete the drift region around the polycrystalline silicon film which is located at a position near the first surface.

Other issues and novel features of the present invention will become apparent from description of the present specification and the appended drawings.

According to one embodiment of the present invention, there is provided a semiconductor device which includes a semiconductor substrate having a first surface and a second surface which is a surface opposite to the first surface, a first insulation isolation film which is arranged in the first surface and in which a first trench which extends in a direction toward the second surface is formed, and a conductive film having a gate electrode, a first buried part which is buried in the first trench and a first cap part which is located on/over the first buried part.

The semiconductor substrate has a source region of a first conductivity type, a drain region of the first conductivity type, a drift region of the first conductivity type and a body region of a second conductivity type which is a conductivity type opposite to the first conductivity type. The source region is arranged in the first surface. The drain region is arranged in the first surface separately from the source region. The drift region is arranged in the first surface so as to surround the drain region. The body region is arranged in the first surface so as to be sandwiched between the drift region and the source region and to surround the source region. The gate electrode faces the body region which is sandwiched between the drift region and the source region while being insulated from the body region. The first cap part projects longer than the first buried part in a channel width direction which is a direction along a boundary between the body region and the drift region in a planar view on/over the first insulation isolation film.

According to the semiconductor device pertaining to the embodiments of the present invention, it is possible to promote depletion of the drift region which is located at a position around the first buried part and near the first surface.

DETAILED DESCRIPTION

Embodiments of the present invention will be described with reference to the drawings. Incidentally, in the following drawings, the same reference codes are assigned to the same or corresponding parts and description thereof is not repeated.

First Embodiment

In the following, a configuration of a semiconductor device according to the first embodiment will be described.

Figure 1:
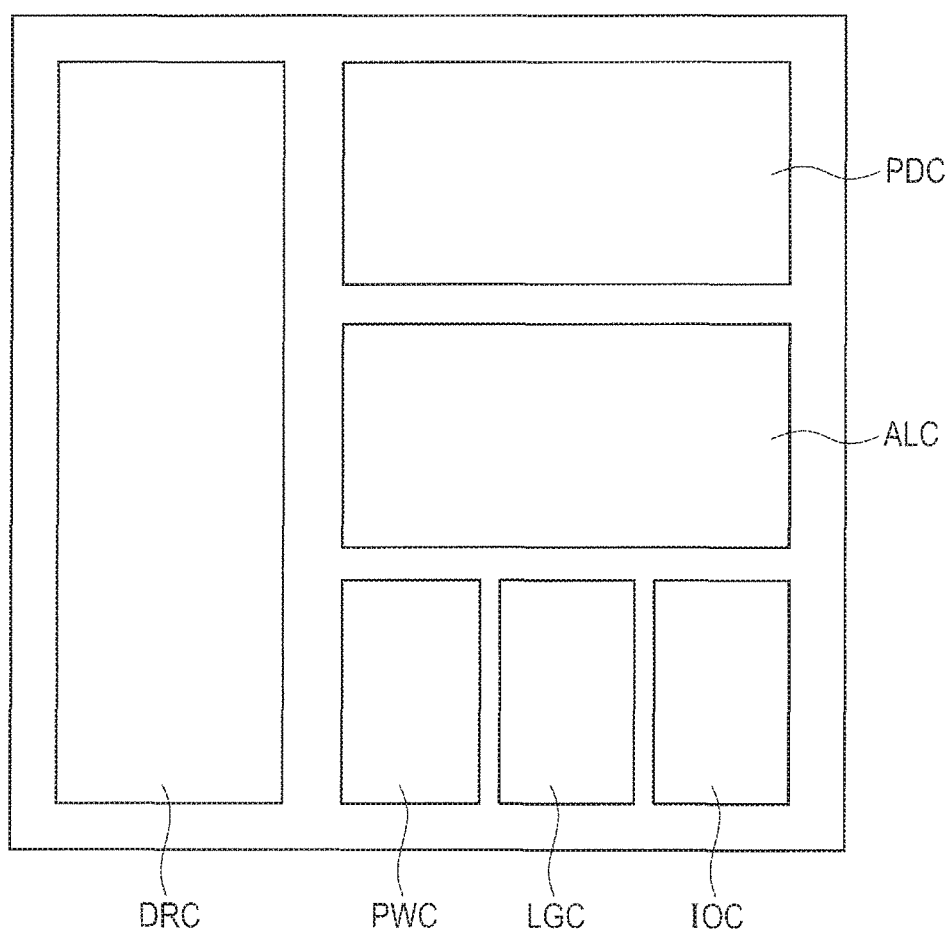
FIG. 1 is a layout diagram illustrating one example of a semiconductor device according to a first embodiment.

As illustrated in FIG. 1, the semiconductor device according to the first embodiment has, for example, a driver circuit DRC, a pre-driver circuit PDC, an analog circuit ALC, a power supply circuit PWC, a logic circuit LGC, an input/output circuit IOC and so forth. The semiconductor device according to the first embodiment is a semiconductor device onto which, for example, a bipolar transistor, a CMOS (Complementary Metal Oxide Semiconductor) transistor and an LDMOS transistor are loaded in a mixed state.

Figure 2:
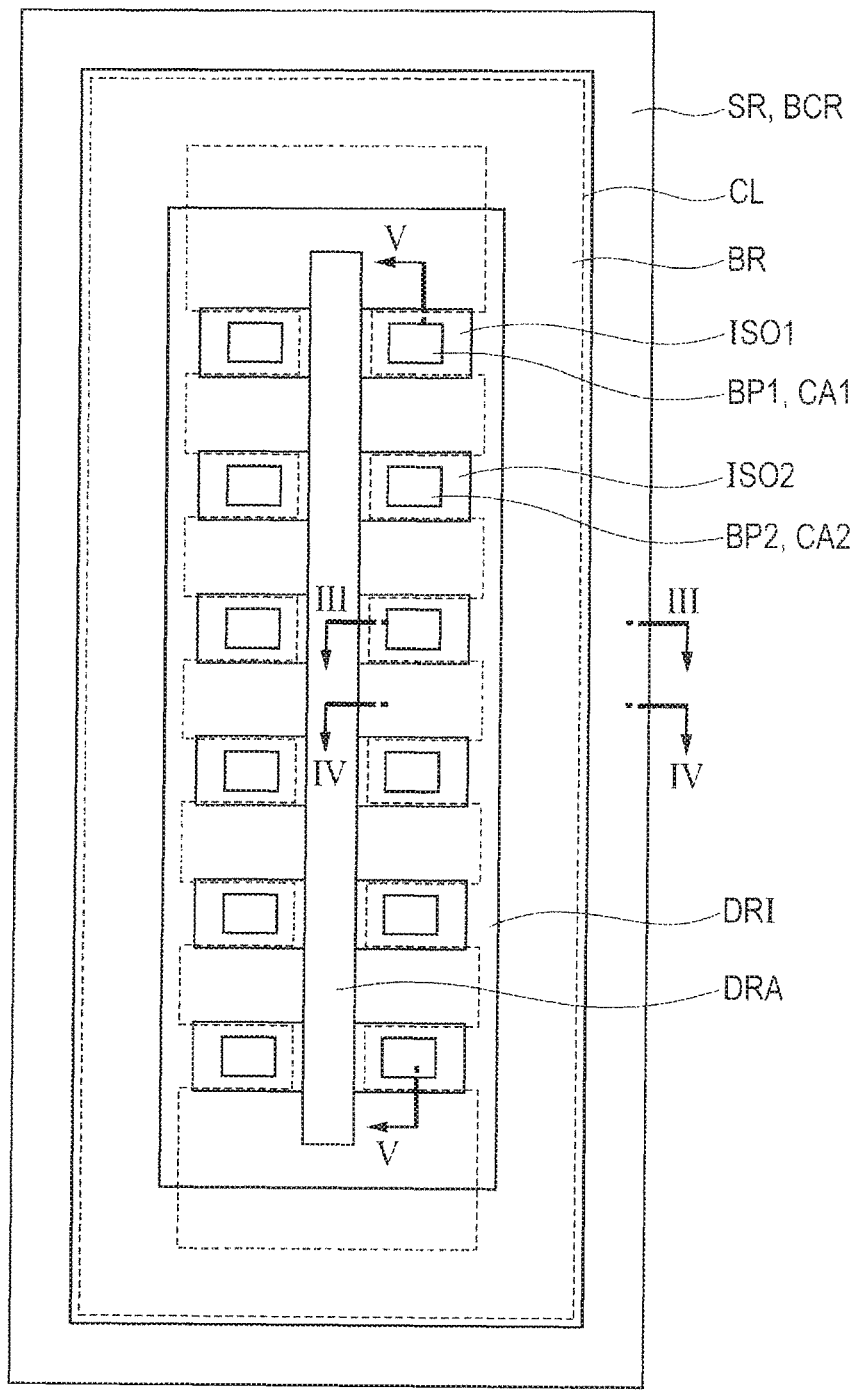
FIG. 2 is a top view illustrating one example of the semiconductor device according to the first embodiment.
Figure 3:
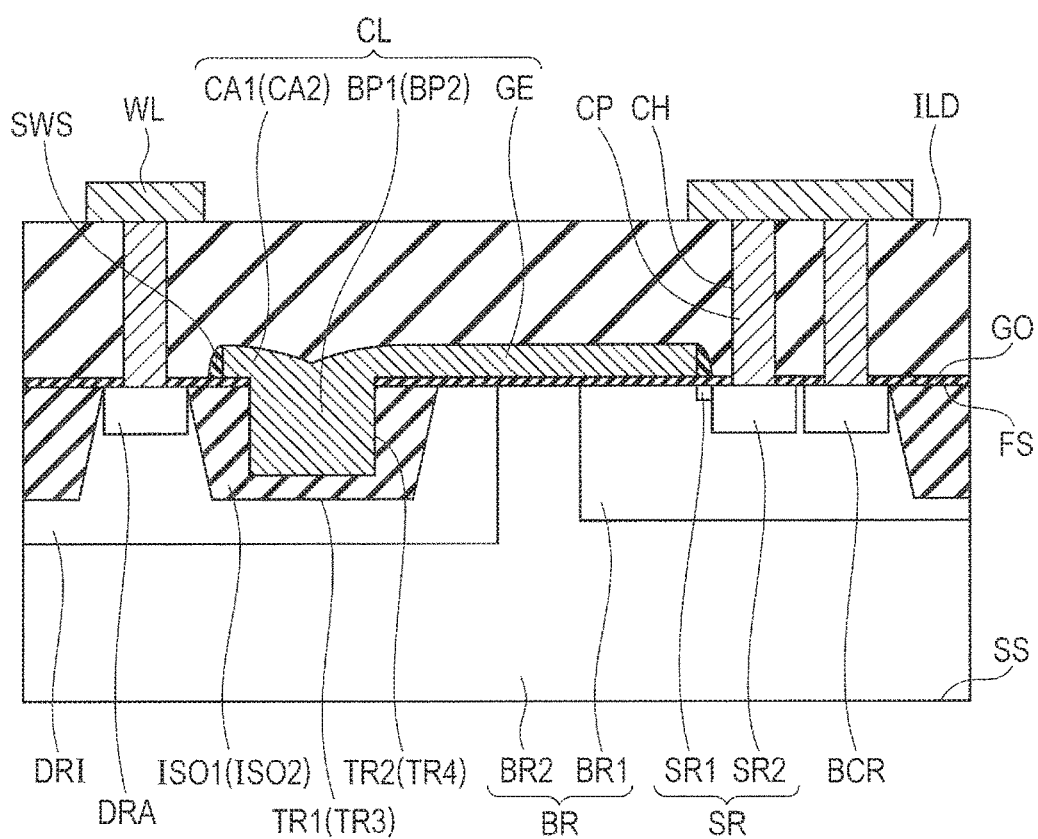
FIG. 3 is a sectional diagram along the III-III in FIG. 2.
Figure 4:
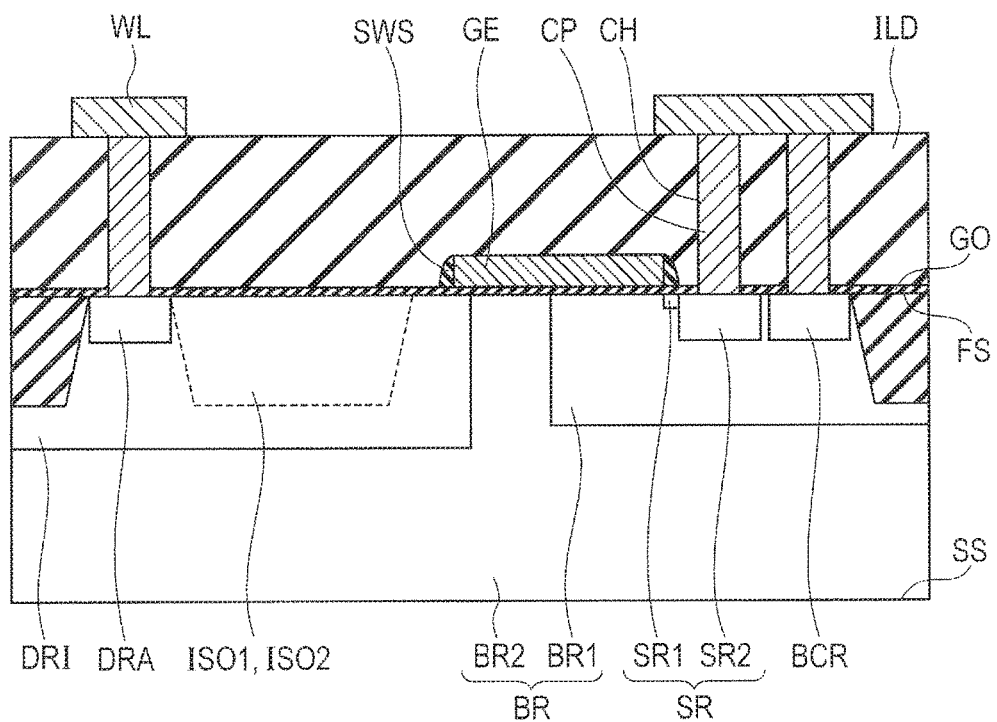
FIG. 4 is a sectional diagram along IV-IV in FIG. 2.

As illustrated in FIG. 2, the semiconductor device according to the first embodiment has the LDMOS transistor, for example, in the input/output circuit IOC. Specifically, the semiconductor device according to the first embodiment has a semiconductor substrate SUB, a first insulation isolation film ISO1, a conductive film CL and so forth in the input/output circuit IOC. As illustrated in FIG. 3 and FIG. 4, the semiconductor device according to the first embodiment further has a gate insulating film GO, an interlayer insulating film ILD, a sidewall spacer SWS, a contact plug CP and wiring WL. The semiconductor device according to the first embodiment may further have a second insulation isolation film ISO2.

The semiconductor substrate SUB has a first surface (surface layer) FS and a second surface (surface layer) SS. The second surface SS is a surface opposite to the first surface FS. The semiconductor substrate SUB is made of, for example, monocrystalline silicon (Si). The semiconductor substrate SUB may be an SOI (Silicon On Insulator) substrate.

The semiconductor substrate SUB has a source region SR, a drain region DRA, a drift region DRI and a body region BR. The semiconductor substrate SUB may further have a body contact region BCR.

The source region SR, the drain region DRA and the drift region DRI have a first conductivity type. The body contact region BCR and the body region BR have a second conductivity type. The second conductivity type is a conductivity type opposite to the first conductivity type. It is preferable that a concentration of impurities in the drift region DRI be lower than concentrations of impurities in the source region SR and the drain region DRA. It is preferable that a concentration of impurities in the body contact region BCR be higher than a concentration of impurities in the body region BR.

The source region SR is arranged in the first surface FS. The source region SR has a first part SR1 and a second part SR2. The first part SR1 is arranged in such a manner that the first part SR1 and the sidewall spacer SWS are mutually superposed in a planar view (in a case of viewing the first part SR1 from a direction orthogonal to the first surface FS). The second part SR2 is arranged in contact with the first part SR1. It is preferable that a concentration of impurities in the first part SR1 be lower than a concentration of impurities in the second part SR2. That is, the first part SR1 has an LDD (Lightly Doped Diffusion) structure.

The drain region DRA is arranged in the first surface FS. The drain region DRA is arranged separately from the source region SR. The body contact region BCR is arranged in the first surface FS.

The drift region DRI is arranged in the first surface FS so as to surround the drain region DRA. The drift region DRI is arranged so as to surround the drain region DRA also in the planar view.

The body region BR is arranged in the first surface FS so as to surround the source region SR and the body contact region BCR. The body region BR has a part which is sandwiched between the drift region DRI and the source region SR. The body region BR is arranged so as to surround the drift region DRI in the planar view.

The body region BR has a first part BR1 and a second part BR2. The first part BR1 is arranged so as to surround the source region SR and the body contact region BCR. The second part BR2 is arranged so as to surround the first part BR1 and the drift region DRI.

The first insulation isolation film ISO1 is arranged in the first surface FS. A trench TR1 maybe formed in the first surface FS. The trench TR1 extends from the first surface FS toward the second surface SS. The first insulation isolation film IS1 is buried in the trench TR1. That is, the first insulation isolation film ISO1 maybe an STI (Shallow Trench Isolation) film. Incidentally, the first insulation isolation film ISO1 may be also a LOCOS (LOCal Oxidation of Silicon) film.

Preferably, the first insulation isolation film ISO1 is arranged in the drift region DRI. More specifically, it is preferable that a source-region-SR-side end of the first insulation isolation film ISO1 be located closer to the drain region DRA side than a boundary between the drift region DRI and the body region BR. In addition, it is preferable that a bottom of the first insulation isolation film ISO1 be located in the drift region DRI. Describing this matter from another view point, it is preferable that the trench TR1 be formed so as not to reach the body region BR.

A trench TR2 is formed in an upper surface of the first insulation isolation film ISO1. The trench TR2 extends in a direction from the upper surface of the first insulation isolation film ISO1 toward the second surface SS. The first insulation isolation film ISO1 is made of, for example, silicon dioxide ($SiO_2$).

The second insulation isolation film ISO2 is arranged in the first surface FS. A trench TR3 maybe formed in the first surface FS. The trench TR3 extends in a direction from the first surface FS toward the second surface SS. The second insulation isolation film ISO2 is buried in the trench TR3. That is, the second insulation isolation film ISO2 may be the STI film. Incidentally, the second insulation isolation film ISO2 may be also the LOCOS film.

Preferably, the second insulation isolation film ISO2 is arranged in the drift region DRI. More specifically, it is preferable that a source-region-SR-side end of the second insulation isolation film ISO2 be located closer to the drain region DRA side than the boundary between the drift region DRI and the body region BR. In addition, it is preferable that a bottom of the second insulation isolation film ISO2 be located in the drift region DRI. Describing this matter from another view point, it is preferable that the trench TR3 be formed so as not to reach the body region BR.

A trench TR4 is formed in an upper surface of the second insulation isolation film ISO2. The trench TR4 extends in a direction from the upper surface of the second insulation isolation film ISO2 toward the second surface SS. The second insulation isolation film ISO2 is made of, for example, $SiO_2$.

As illustrated in FIG. 2, a part of the drift region DRI is sandwiched between the first insulation isolation film ISO1 and the second insulation isolation film ISO2 in a direction along the body region BR and the drift region DRI in the planar view (in the following, this direction will be called a channel width direction). Describing this matter from another view point, the first insulation isolation film ISO1 and the second insulation isolation film ISO2 are arranged separately from each other in the channel width direction.

The number of the first insulation isolation films ISO1 and the number of the second insulation isolation films ISO2 may be plural. That is, the first insulation isolation film ISO1, the drift region DRI and the second insulation isolation film ISO2 may be repetitively arranged along the channel width direction.

As illustrated in FIG. 3 and FIG. 4, the gate insulating film GO is arranged on/over the first surface FS. More specifically, the gate insulating film GO is arranged on/over a part of the body region BR which is sandwiched between the drift region DRI and the source region SR. The gate insulting film GO is made of, for example, $SiO_2$.

The conductive film CL has a gate electrode GE, a first buried part BP1 and a first cap part CA1. The conductive film CL may further have a second buried part BP2 and a second cap part CA2. The conductive film CL is made of, for example, polycrystalline silicon into which impurities are doped.

The gate electrode GE is arranged on/over the gate insulating film GO. Thereby, the gate electrode GE faces the part of the body region BR which is sandwiched between the source region SR and the drift region DRI while being insulated from the part. It is preferable that a drain-region-DRA-side end of the gate electrode GE be located closer to the source region SR side than source-region-SR-side ends of the first insulation isolation film ISO1 and the second insulation isolation film ISO2.

Figure 5:
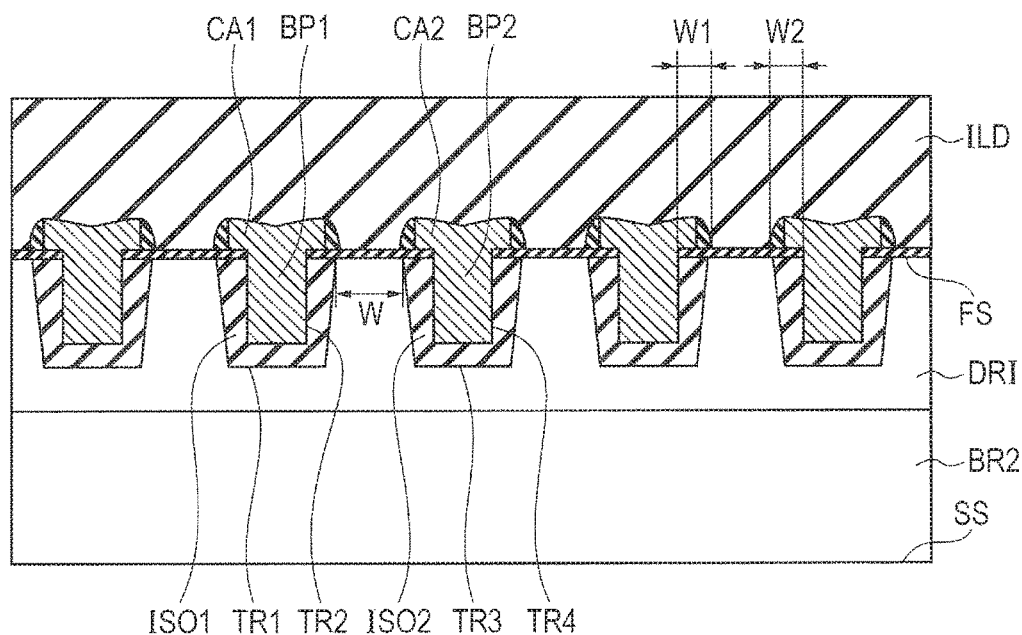
FIG. 5 is a sectional diagram along V-V in FIG. 2.

The first buried part BP1 is buried in the trench TR2. The first cap part CA1 is arranged on/over the first buried part BP1. As illustrated in FIG. 5, the first cap part CA1 projects from the first buried part BP1 in the channel width direction on/over the first insulation isolation film ISO1. Describing this matter from another view point, the first cap part CA1 extends along the part of the drift region DR1 which is located between the first insulation isolation film ISO1 and the second insulation isolation film ISO2 on/over the first insulation isolation film ISO1.

The second buried part BP2 is buried in the trench TR4. It is preferable that the second buried part BP2 be arranged so as to face the first buried part BP1 in the channel width direction. The second cap part CA2 is arranged on/over the second buried part BP2. The second cap part CA2 projects from the second buried part BP2 in the channel width direction on/over the second insulation isolation film ISO2. Describing this matter from another view point, the second cap part CA2 extends along the part of the drift region DR1 which is located between the first insulation isolation film ISO1 and the second insulation isolation film ISO2 on/over the second insulation isolation film ISO2.

A maximum value of a width in the channel width direction of the part of the drift region DR1 which is sandwiched between the first insulation isolation film ISO1 and the second insulation isolation film ISO2 is defined as a width W. It becomes easier to deplete the part of the drift region DR1 which is sandwiched between the first insulation isolation film ISO1 and the second insulation isolation film ISO2 as the width W is narrowed. Specifically, it is preferable that the width W be not more than 0.3 μm.

A maximum value of a width of the first insulation isolation film ISO1 which is measured between the first buried part BP1 and the part of the drift region DR1 which is sandwiched between the first insulation isolation film ISO1 and the second insulation isolation film ISO2 is defined as a width W1. Describing this matter from another view point, the width W1 is the maximum value of the width of the first insulation isolation film ISO1 which is measured between the first buried part BP1 and the part of the drift region DRI in the channel width direction. It becomes easier to deplete the part of the drift region DR1 which is sandwiched between the first insulation isolation film ISO1 and the second insulation isolation film ISO2 as the width W1 is narrowed. Specifically, it is preferable that the width W1 be not more than 0.3 μm. It is preferable that the width W1 be larger than a thickness of the gate insulating film GO.

A maximum value of a width of the second insulation isolation film ISO2 which is measured between the second buried part BP2 and the part of the drift region DR1 which is sandwiched between the first insulation isolation film ISO1 and the second insulation isolation film ISO2 is defined as a width W2. Describing this matter from another view point, the width W2 is the maximum value of the width of the second insulation isolation film ISO2 which is measured between the second buried part BP2 and the part of the drift region DRI in the channel width direction. It becomes easier to deplete the part of the drift region DR1 which is sandwiched between the first insulation isolation film ISO1 and the second insulation isolation film ISO2 as the width W2 is narrowed. Specifically, it is preferable that the width W2 be not more than 0.3 μm. It is preferable that the width W2 be larger than the thickness of the gate insulating film GO.

It is preferable that a depth of the trench TR2 and a depth of the trench TR4 be large. It is preferable that a thickness of the first insulation isolation film ISO1 which is measured between the first buried part BP1 and the bottom of the first insulation isolation film ISO1 be larger than the thickness of the gate insulating film GO. It is preferable that a thickness of the second insulation isolation film ISO2 which is measured between the second buried part BP2 and the bottom of the second insulation isolation film ISO2 be larger than the thickness of the gate insulating film GO.

It is preferable that a width of the first insulation isolation film ISO1 which is measured between the first buried part BP1 and a drain-region-DRA-side end of the first insulation isolation film ISO1 be larger than the thickness of the gate insulating film GO. It is preferable that a width of the second insulation isolation film ISO2 which is measured between the second buried part BP2 and a drain-region-DRA-side end of the second insulation isolation film ISO2 be larger than the thickness of the gate insulating film GO.

It is preferable that a width of the first insulation isolation film ISO1 which is measured between the first buried part BP1 and the source-region-SR-side end of the first insulation isolation film ISO1 be larger than the thickness of the gate insulating film GO. It is preferable that a width of the second insulation isolation film ISO2 which is measured between the second buried part BP2 and the source-region-SR-side end of the second insulation isolation film ISO2 be larger than the thickness of the gate insulating film GO.

As illustrated in FIG. 3 and FIG. 4, the sidewall spacer SWS is arranged on each sidewall of the conductive film CL. For example, $SiO_2$ is used as the material of the sidewall spacer SWS.

The interlayer insulating film ILD is arranged on/over the first surface FS. The interlayer insulating film ILD is arranged so as to cover the conductive film CL and the sidewall spacer SWS. A contact hole CH is formed in the interlayer insulating film ILD. The source region SR, the body contact region BCR and the drain region DRA are exposed from the contact hole CH which is formed passing through the interlayer insulating film ILD. Incidentally, although not illustrated in the drawing, the conducive film CL is exposed from the contact hole CH. The interlayer insulating film ILD is made of, for example, $SiO_2$.

The contact plug CP is arranged in the interlayer insulating film ILD. More specifically, the contact plug CP is buried in the contact hole CH. The contact plug CP is electrically coupled to the source region SR, the body contact region BCR, the drain region DRA and the conductive film CL at one end. The contact plug CP is made of, for example, tungsten (W).

The wiring WL is formed on/over the interlayer insulating film ILD. The wiring WL is electrically coupled to the other end of the contact plug CP. The wiring WL is made of, for example, aluminum (Al).

In the following, a manufacturing method for the semiconductor device according to the first embodiment will be described.

Figure 6:
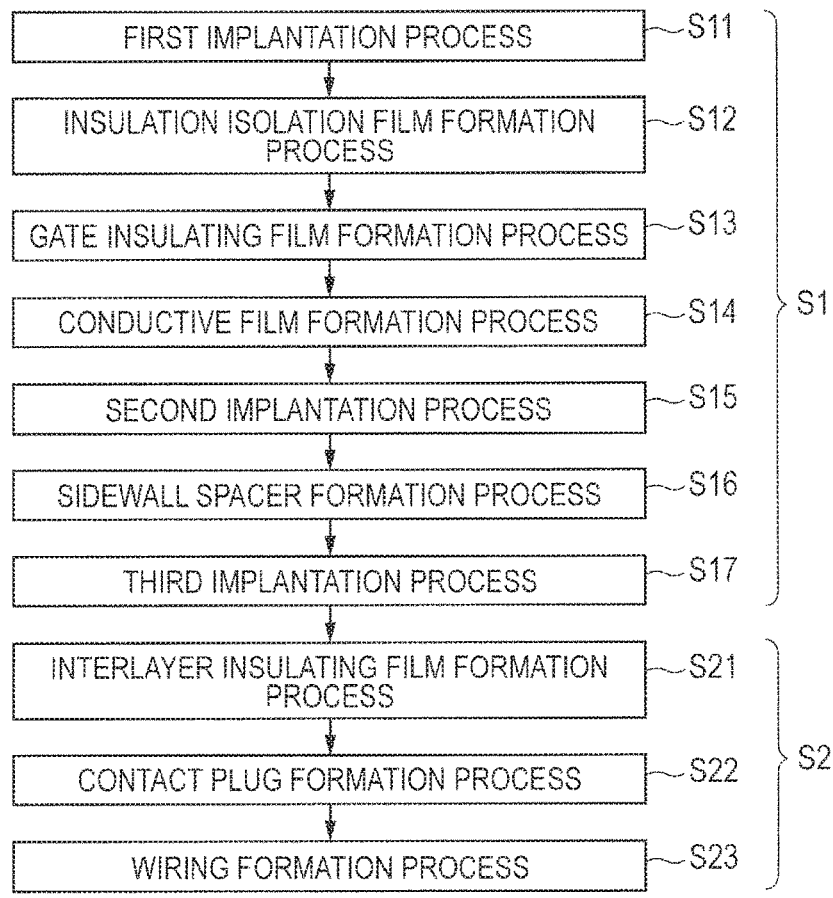
FIG. 6 is a process diagram illustrating one example of a manufacturing method for the semiconductor device according to the first embodiment.

As illustrated in FIG. 6, the manufacturing method for the semiconductor device according to the first embodiment has a front-end process S1 and a back-end process S2.

The front-end process S1 has a first implantation process S11, an insulation isolation film formation process S12, a gate insulating film formation process S13, a conductive film formation process S14, a second implantation process S15, a sidewall spacer formation process S16 and a third implantation process S17. The back-end process S2 has an interlayer insulating film formation process S21, a contact plug formation process S22 and a wiring formation process S2.

Figure 7:
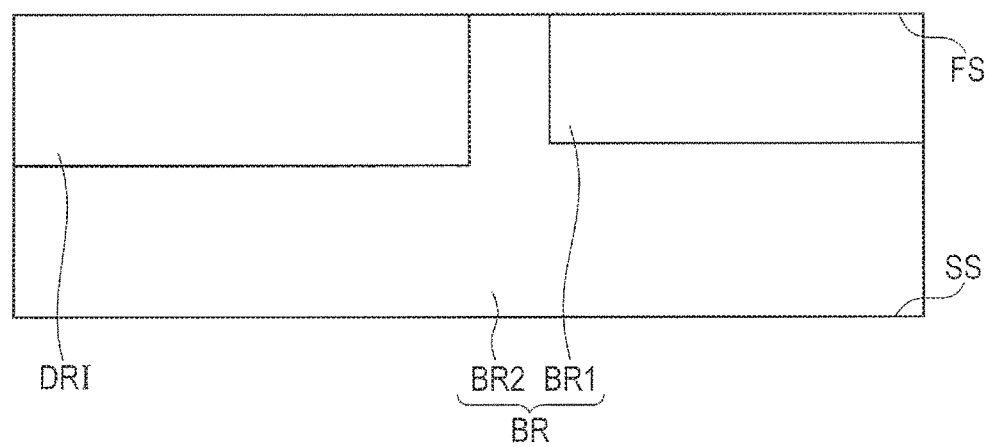
FIG. 7 is a sectional diagram illustrating one example of the semiconductor device according to the first embodiment in a first implantation process.

As illustrated in FIG. 7, in the first implantation process S11, the drift region DRI and the body region BR are formed. The drift region DRI and the body region BR are formed by, for example, ion implantation. The drift region DRI and the body region BR may be formed by performing post-ion-implantation thermal diffusion in addition to the ion implantation. Incidentally, a part of the semiconductor substrate SUB where the drift region DRI and the first part BR1 are not formed configures the second part BR2.

Figure 8A:
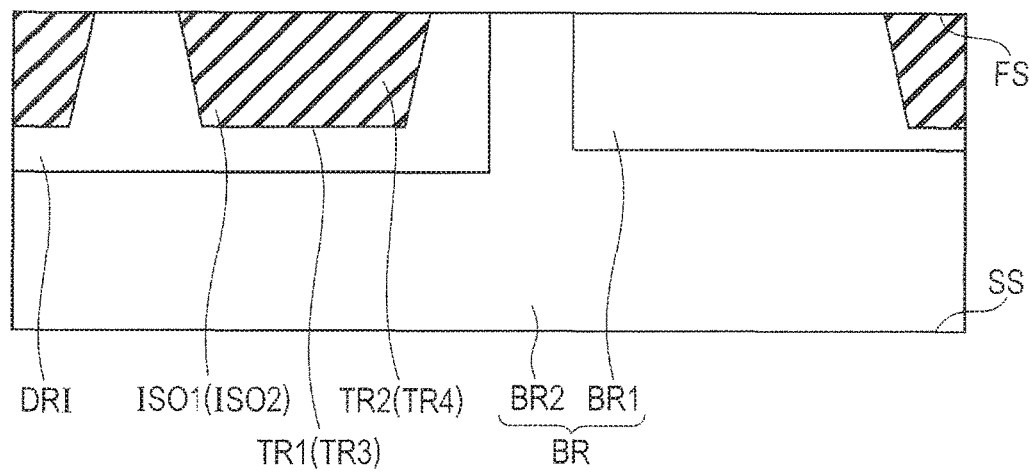
FIG. 8A is a sectional diagram illustrating one example of a region where an insulation isolation film of the semiconductor device according to the first embodiment is formed in an insulation isolation film formation process.
Figure 8B:
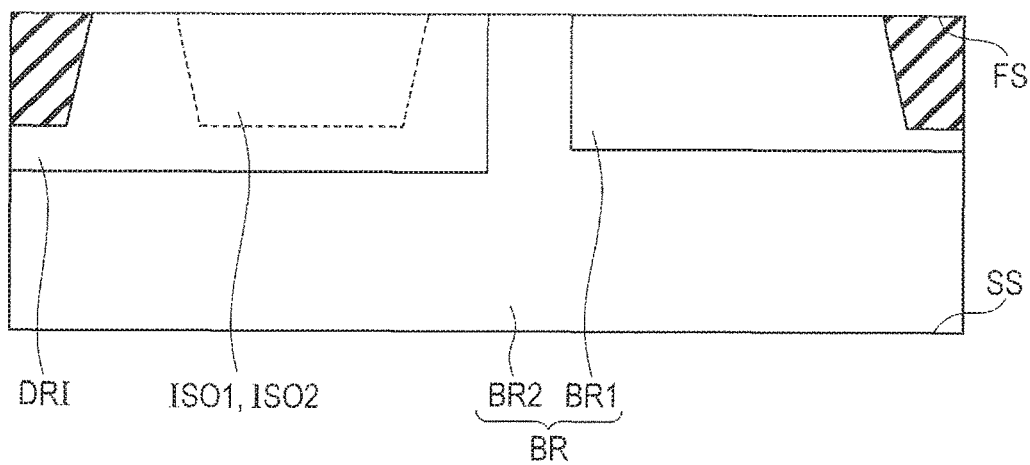
FIG. 8B is a sectional diagram illustrating one example of a region where the insulation isolation film of the semiconductor device according to the first embodiment is not formed in the insulation isolation film formation process.

As illustrated in FIG. 8A and FIG. 8B, in the insulation isolation film formation process S12, formation of the first insulation isolation film ISO1 and the second insulation isolation film ISO2 is performed. In formation of the first insulation isolation film ISO1 and the second insulation isolation film ISO2, firstly, formation of the trench TR1 and the trench TR3 is performed. Formation of the trench TR1 and the trench TR3 is performed by, for example, anisotropic etching such as RIE (Reaction Ion Etching) and so forth.

In formation of the first insulation isolation film ISO1 and the second insulation isolation film ISO2, secondly, burying of a material which configures the first insulation isolation film ISO1 and the second insulation isolation film ISO2 into the trench TR1 and the trench TR3 is performed. In this burying, first, the material which configures the first insulation isolation film ISO1 and the second insulation isolation film ISO2 is deposited onto the first surface FS by, for example, CVD (Chemical Vapor Deposition) and so forth. Then, the material which configures the first insulation isolation film ISO1 and the second insulation isolation film ISO2 and protrudes from the trench TR1 and the trench TR3 is removed by, for example, CMP (Chemical Mechanical Polishing) and so forth.

Figure 9A:
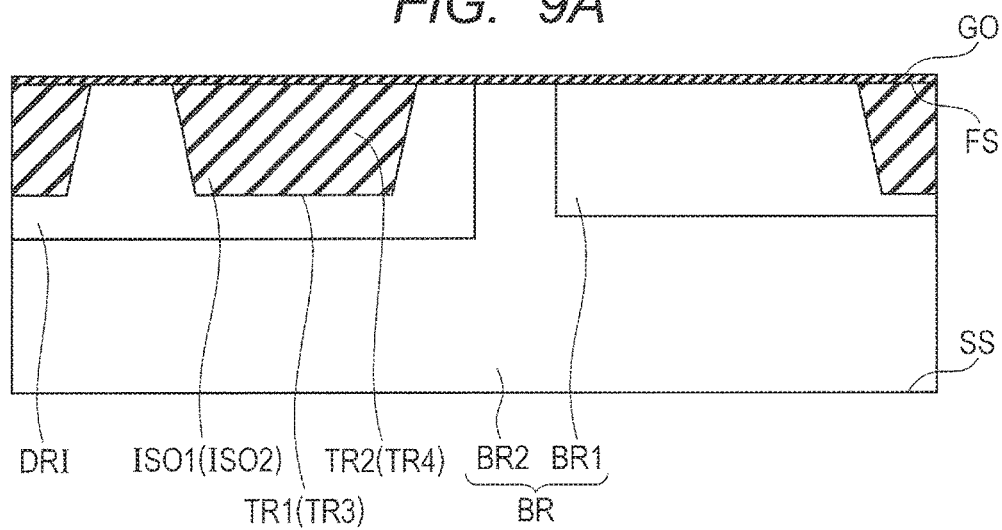
FIG. 9A is a sectional diagram illustrating one example of a region where the insulation isolation film of the semiconductor device according to the first embodiment is formed in a gate insulating film formation process.
Figure 9B:
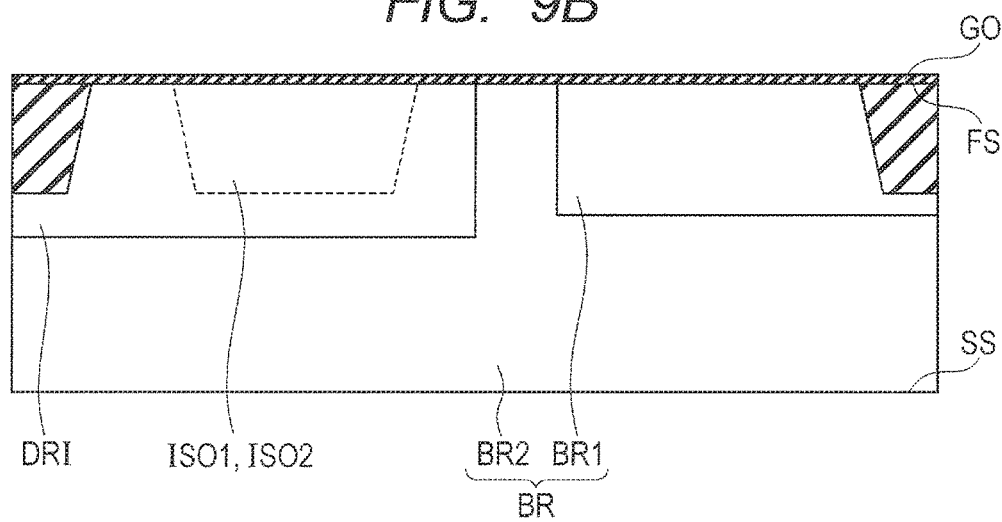
FIG. 9B is a sectional diagram illustrating one example of a region where the insulation isolation film of the semiconductor device according to the first embodiment is not formed in the gate insulating film formation process.

As illustrated in FIG. 9A and FIG. 9B, in the gate insulating film formation process S13, the gate insulating film GO is formed. Formation of the gate insulating film GO is performed by, for example, thermally oxidizing the first face FS side of the semiconductor substrate SUB.

Figure 10A:
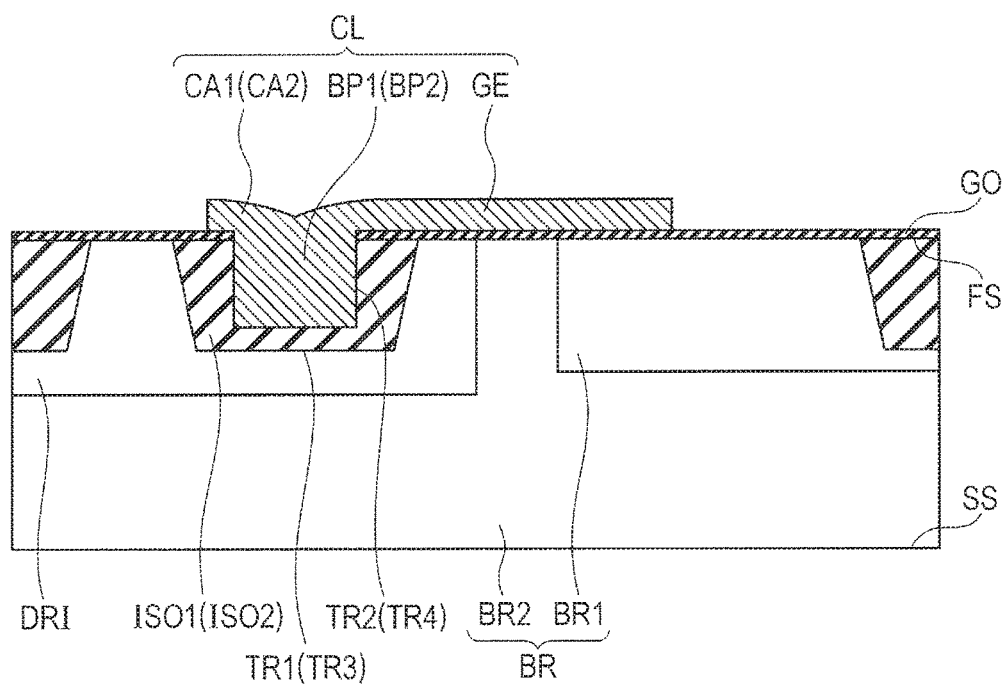
FIG. 10A is a sectional diagram illustrating one example of a region where the insulation isolation film of the semiconductor device according to the first embodiment is formed in a conductive film formation process.
Figure 10B:
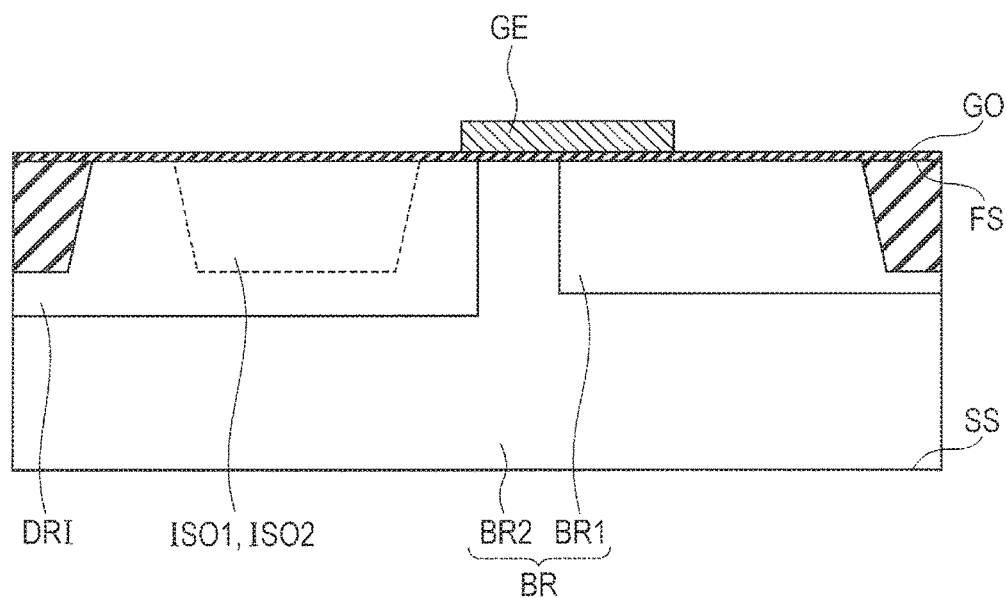
FIG. 10B is a sectional diagram illustrating one example of a region where the insulation isolation film of the semiconductor device according to the first embodiment is not formed in the conductive film formation process.

As illustrated in FIG. 10A and FIG. 10B, in the conductive film formation process S14, formation of the conductive film CL is performed. In formation of the conductive film CL, firstly, formation of the trench TR2 and the trench TR4 is performed. Formation of the trench TR2 and the trench TR4 is performed by, for example, anisotropic etching such as the RIE and so forth using a photoresist as a mask.

In formation of the conductive film CL, secondly, film-formation of a material which configures the conductive film CL is performed. Film-formation of the material which configures the conductive film CL is performed by, for example, the CVD and so forth. Thereby, the material which configures the conductive film CL is film-formed on/over the gate insulating film GO, on/over the first insulation isolation film ISO1 and the second insulation isolation film ISO2 and in the trench TR2 and the trench TR4.

In formation of the conducive film CL, thirdly, patterning of the film-formed conductive film CL is performed. Patterning of the material which configures the film-formed conducive film CL is performed by, for example, photolithography and etching. From the above, the first buried part BP1, the second buried part BP2, the first cap part CA1, the second cap part CA2 and the gate electrode GE are formed.

Figure 11A:
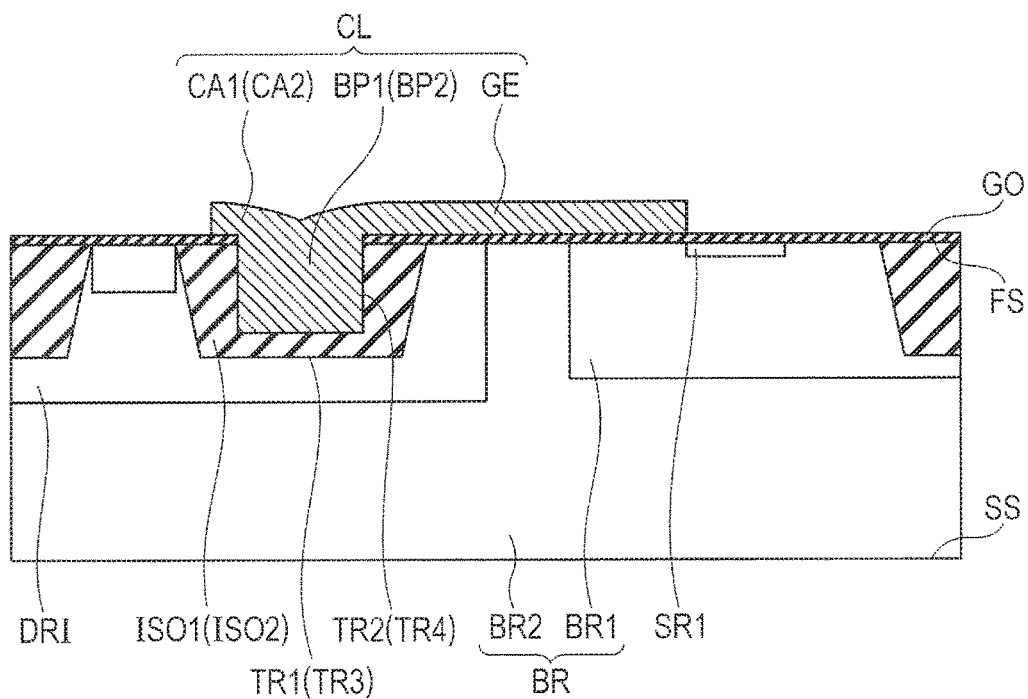
FIG. 11A is a sectional diagram illustrating one example of a region where the insulation isolation film of the semiconductor device according to the first embodiment is formed in a second implantation process.
Figure 11B:
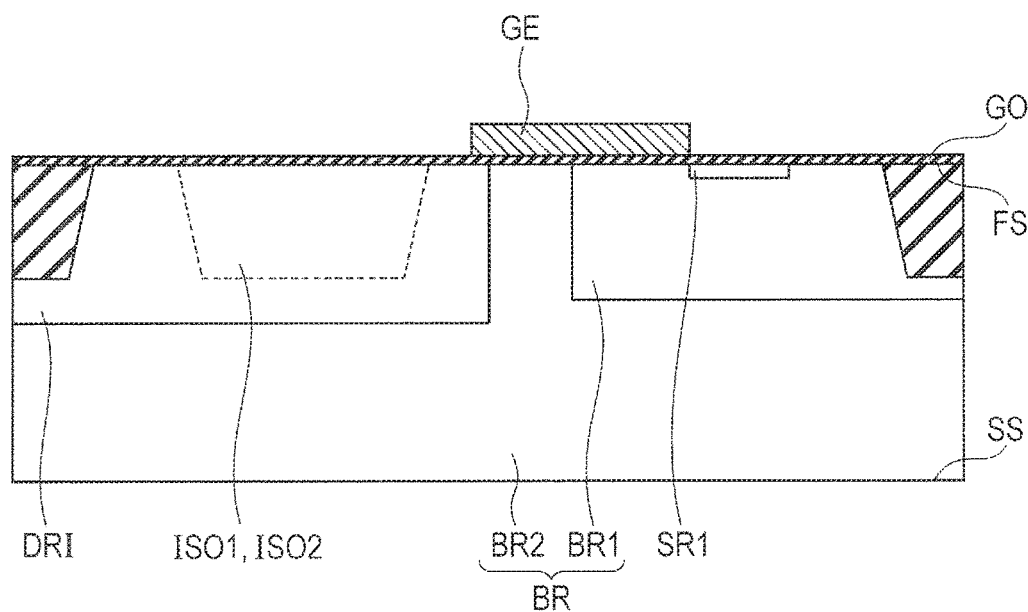
FIG. 11B is a sectional diagram illustrating one example of a region where the insulation isolation film of the semiconductor device according to the first embodiment is not formed in the second implantation process.

As illustrated in FIG. 11A and FIG. 11B, in the second implantation process S15, formation of the first part SR1 is performed. Formation of the first part SR1 is performed by, for example, ion implantation using the gate electrode GE, the first insulation isolation film ISO1, the second insulation isolation film ISO2 and the photoresist as masks.

Figure 12A:
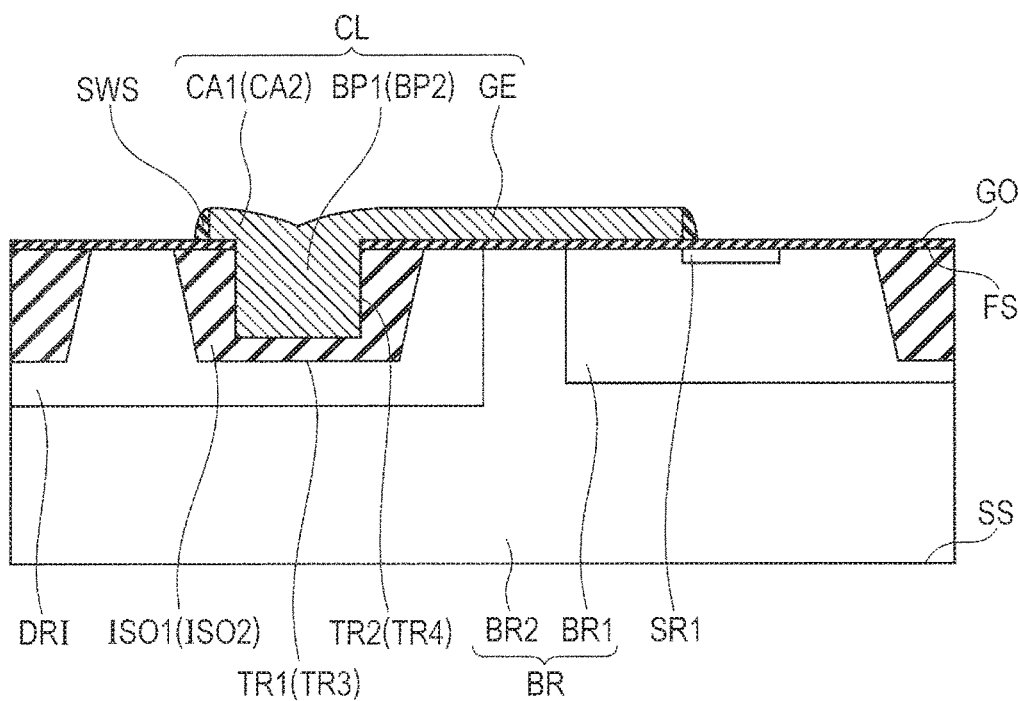
FIG. 12A is a sectional diagram illustrating one example of a region where the insulation isolation film of the semiconductor device according to the first embodiment is formed in a sidewall formation process.
Figure 12B:
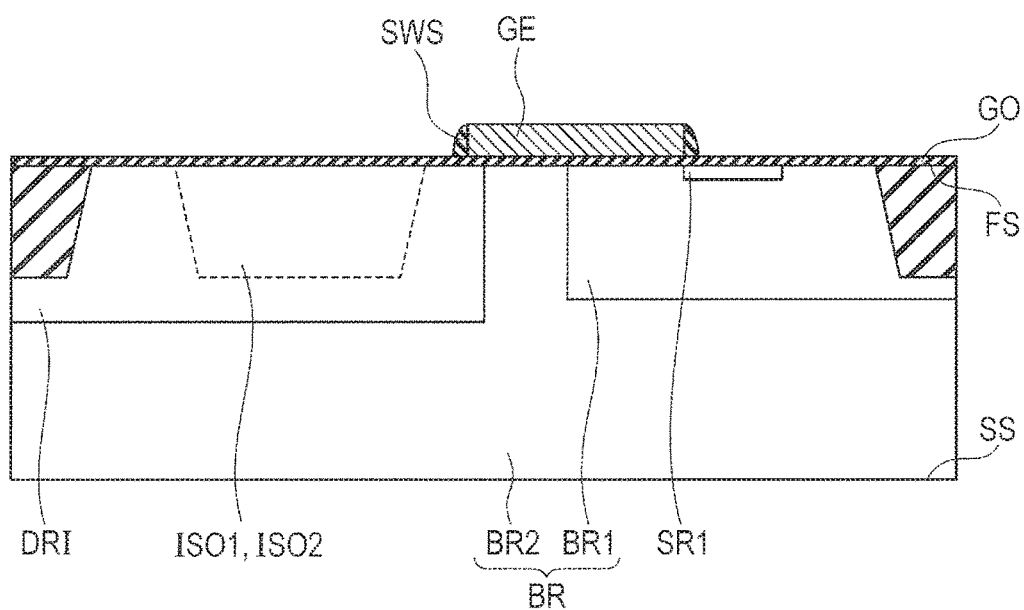
FIG. 12B is a sectional diagram illustrating one example of a region where the insulation isolation film of the semiconductor device according to the first embodiment is not formed in the sidewall formation process.

As illustrated in FIG. 12A and FIG. 12B, in the sidewall spacer formation process S16, the sidewall spacer SWS is formed. In formation of the sidewall spacer SWS, firstly, a material which configures the sidewall spacer SWS is film-formed on/over the first surface FS. In formation of the sidewall spacer SWS, secondary, the material which configures the film-formed sidewall spacer SWS is etched. From the above, formation of the sidewall spacer SWS is performed.

Figure 13A:
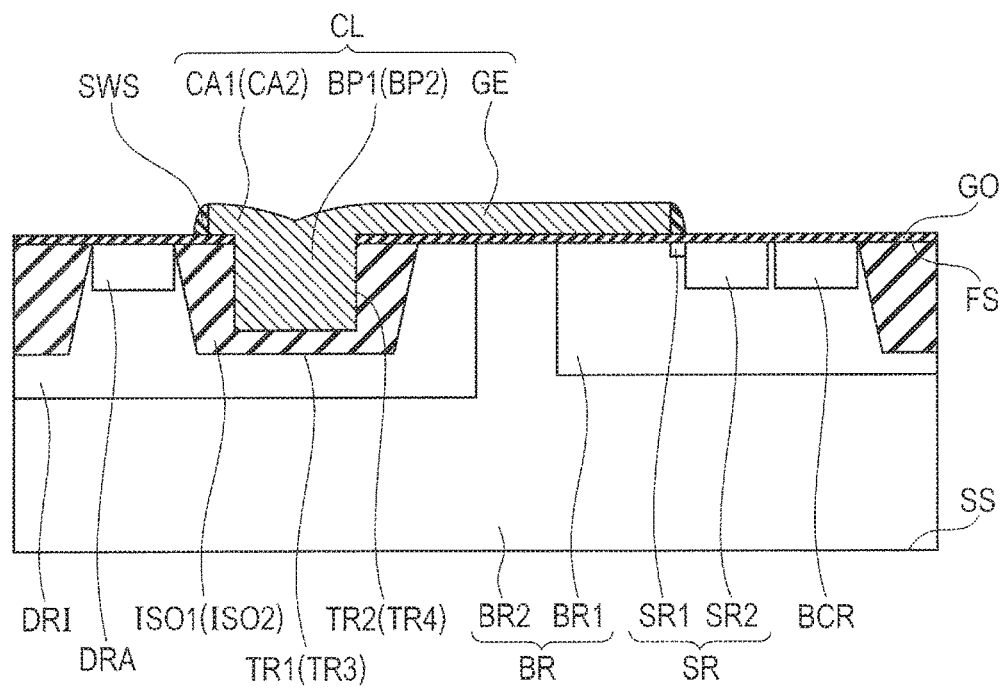
FIG. 13A is a sectional diagram illustrating one example of a region where the insulation isolation film of the semiconductor device according to the first embodiment are formed in a third implantation process.
Figure 13B:
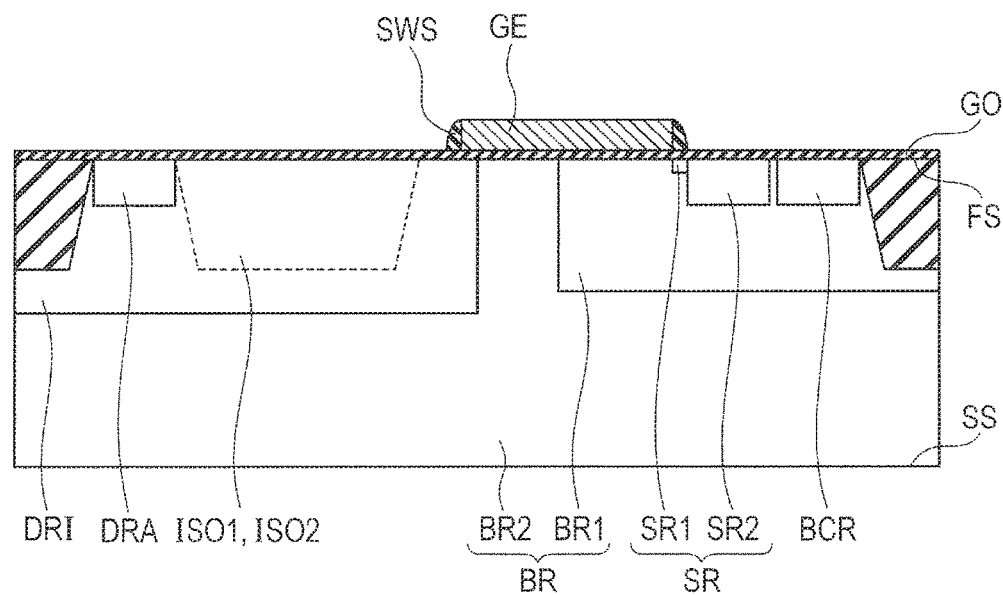
FIG. 13B is a sectional diagram illustrating one example of a region where the insulation isolation film of the semiconductor device according to the first embodiment are not formed in the third implantation process.

As illustrated in FIG. 13A and FIG. 13B, in the third implantation process S17, formation of the source region SR (the second part SR2), the drain region DRA and the body contact region BCR is performed. Formation of the second part SR2, the drain region DRA and the body contact region BCR is performed by, for example, ion implantation by using the gate electrode GE, the sidewall spacer SWS, the first insulation isolation film ISO1, the second insulation isolation film ISO2 and the photoresist as the masks.

Incidentally, apart of the first surface FS where the source region SR is arranged, a part of the first surface FS where the drain region DRA is arranged, a part of the first surface FS where the body contact region BCR is arranged and the upper surface of the gage electrode GE may be subjected to silicidation after performing the third implantation process S17 and before performing the interlayer insulating film formation process S21.

In the above-described silicidation, firstly, parts other than the part of the first surface FS where the source region SR is arranged, the part of the first surface FS where the drain region DRA is arranged, the part of the first surface FS where the body contact region BCR is arranged and the upper surface of the gage electrode GE are covered with a silicide block film which is made by, for example, $SiO_2$ and so forth. Secondly, cobalt (Co), titanium (Ti) and so forth are film-formed on/over the first surface FS by, for example, sputtering and so forth.

Thirdly, Co, Ti and so forth which are film-formed on/over the first surface FS are caused to react with the part of the first surface FS where the source region SR is arranged, the part of the first surface FS where the drain region DRA is arranged, the part of the first surface FS where the body contact region BCR is arranged and the upper surface of the gate electrode GE by performing, for example, heat treatment. Fourthly, Ti, Co and so forth which remain unreacted are removed by, for example, etching and so forth. From the above, the part of the first surface FS where the source region SR is arranged, the part of the first surface FS where the drain region DRA is arranged, the part of the first surface FS where the body contact region BCR is arranged and the upper surface of the gate electrode GE are silicided.

Figure 14A:
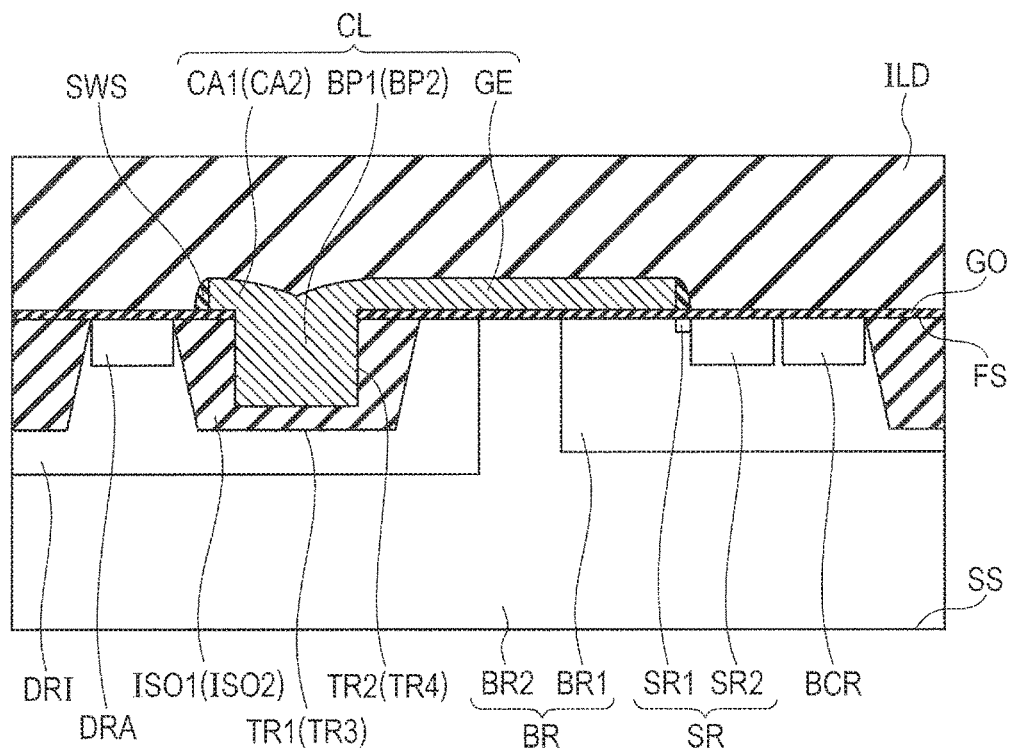
FIG. 14A is a sectional diagram illustrating one example of a region where the insulation isolation film of the semiconductor device according to the first embodiment is formed in an interlayer insulating film formation process.
Figure 14B:
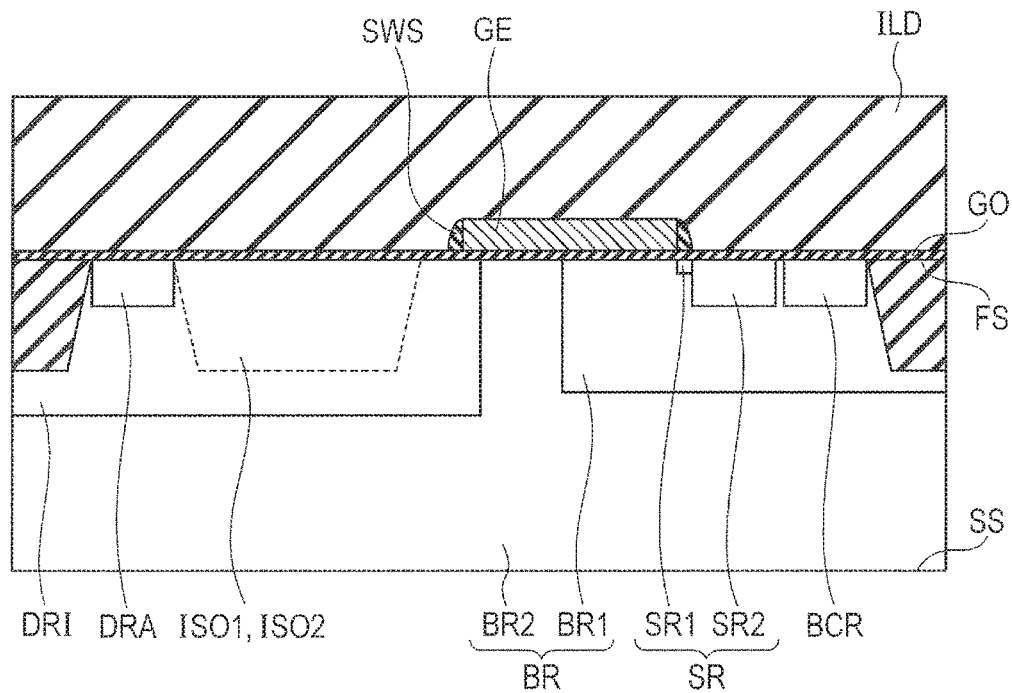
FIG. 14B is a sectional diagram illustrating one example of a region where the insulation isolation film of the semiconductor device according to the first embodiment is not formed in the interlayer insulating film formation process.

As illustrated in FIG. 14A and FIG. 14B, in the interlayer insulating film formation process S21, formation of the interlayer insulating film ILD is performed. In formation of the interlayer insulating film ILD, firstly, a material which configures the interlayer insulating film ILD is film-formed on/over the first surface FS. Film-formation of the material which configures the interlayer insulating film ILD is performed by, for example, the CVD. In formation of the interlayer insulating film ILD, secondly, the material which configures the film-formed interlayer insulating film ILD is flattened by, for example, the CMP and so forth.

Figure 15A:
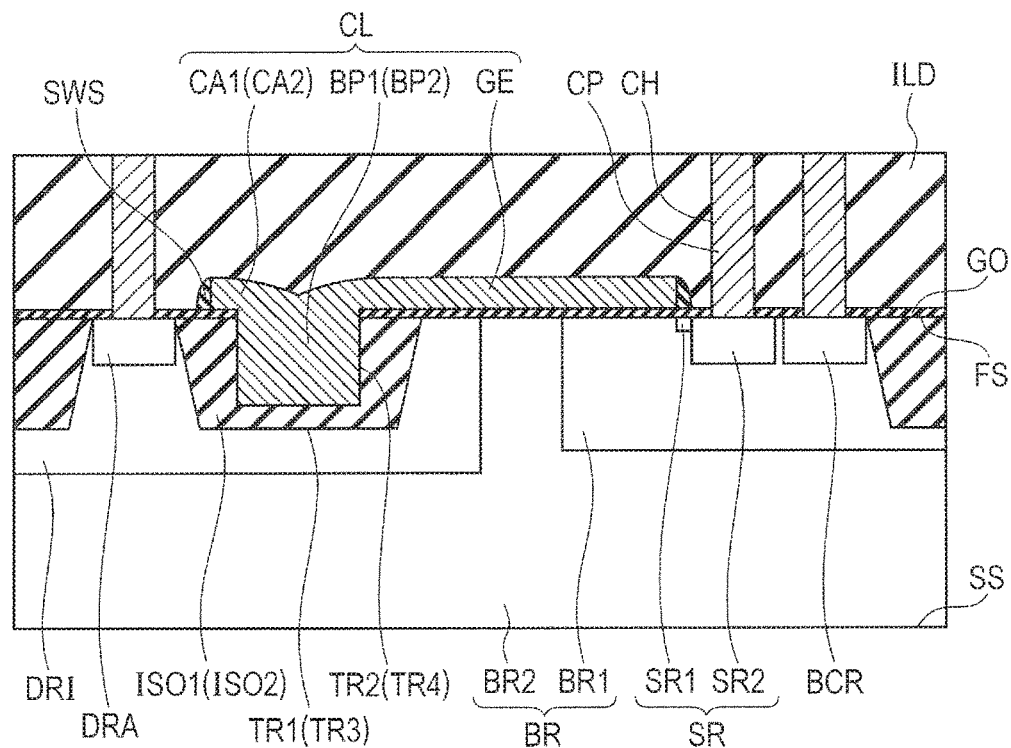
FIG. 15A is a sectional diagram illustrating one example of a region where the insulation isolation film of the semiconductor device according to the first embodiment is formed in a contact plug formation process.
Figure 15B:
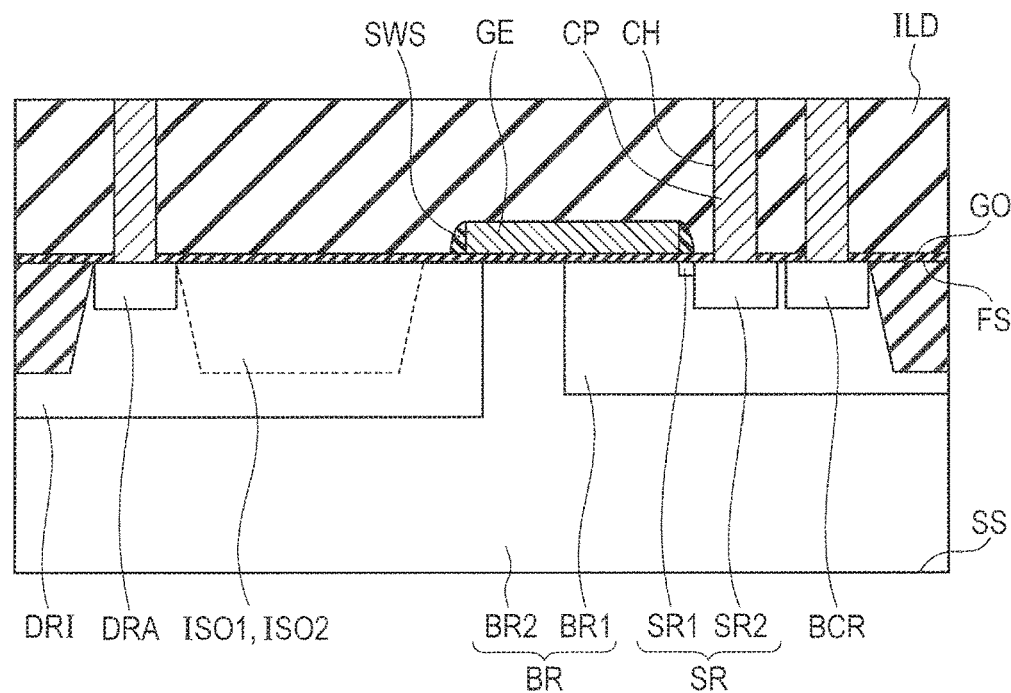
FIG. 15B is a sectional diagram illustrating one example of a region where the insulation isolation film of the semiconductor device according to the first embodiment is not formed in the contact plug formation process.

As illustrated in FIG. 15A and FIG. 15B, in the contact plug formation process S22, the contact plug CP is formed. In formation of the contact plug CP, firstly, the contact hole CH is formed in the interlayer insulating film ILD. Formation of the contact hole CH is performed by, for example, anisotropic etching such as the RIE and so forth. In formation of the contact plug CP, secondly, a material which configures the contact plug CP is buried into the contact hole CH by, for example, the CVD and so forth. In formation of the contact plug CP, thirdly, the material which configures the contact plug CP and protrudes from the contact hole CH is removed by, for example, the CMP, etching-back and so forth.

In the wiring formation process S23, formation of the wiring WL is performed. In formation of the wiring WL, film-formation of a material which configures the wiring WL is performed on/over the interlayer insulating film ILD by, for example, sputtering and so forth. In formation of the wiring WL, secondly, patterning of the material which configures the film-formed wiring WL is performed by, for example, photolithography, etching and so forth.

From the above, performance of the manufacturing method for the semiconductor device according to the first embodiment is completed and the structure of the semiconductor device according to the first embodiment illustrated in FIG. 2, FIG. 3, FIG. 4 and FIG. 5 is formed. Incidentally, the first implantation process S11 may be performed after performing the insulation isolation film formation process S12.

In the following, an effect of the semiconductor device according to the first embodiment will be described.

The conducive film CL of the semiconductor device according to the first embodiment has the first buried part BP1 which is buried into the trench TR2 in the first insulation isolation film ISO1 and the first cap part CA1 which is arranged on/over the first buried part BP1. Since the first cap part CA1 projects from the first buried part BP1 toward the drift region DR1 in the channel width direction, it becomes easy to deplete a part of the drift region DRI which is located in the vicinity of the first surface FS.

Therefore, it is possible to promote depletion of a part of the drift region DRI which is located around the first buried part BP1 including the part which is located in the vicinity of the first surface FS in the semiconductor device according to the first embodiment. Consequently, according to the semiconductor device pertaining the first embodiment, it is possible to improve the off-state breakdown voltage in comparison with a case of no provision of the first cap part CA1.

In particular, in a case where the semiconductor device according to the first embodiment has the second insulation isolation film ISO2, the second buried part BP2 and the second cap part CA2, it is possible to deplete the part of the drift region DRI which is sandwiched between the first insulation isolation film ISO1 and the second insulation isolation film ISO2 from the both sides in the channel width direction. Therefore, in this case, it is possible to more improve the off-state breakdown voltage.

Figure 16:
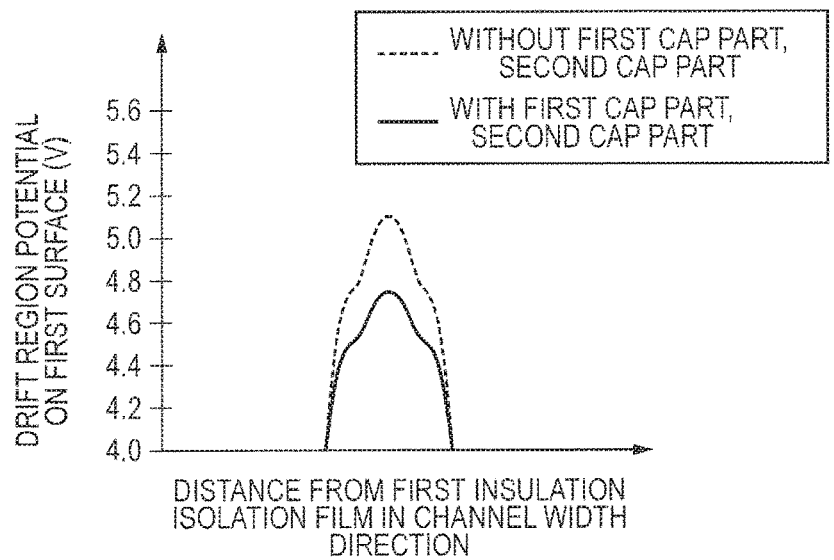
FIG. 16 is a graph illustrating one example of a relation between a potential of a drift region which is sandwiched between a first insulation isolation film and a second insulation isolation film in a first surface and a distance of the drift region measured from the first insulation isolation film in a channel width direction in the semiconductor device according to the first embodiment.

The above-described effect is also confirmed by simulations. In a case where the first cap part CA1 and the second cap part CA2 are provided, a maximum value of a potential of the drift region DRI in the first surface FS is lowered in comparison with the case of no provision of the first and second caps CA1 and CA2 as illustrated in FIG. 16. Consequently, a curve indicating the potential of the drift region DRI in the first surface FS gently changes along the channel width direction. The above-described effect is also confirmed by one simulation in this way.

Incidentally, in FIG. 16, the horizontal axis indicates a distance of the drift region DRI measured from the first insulation isolation film ISO1 in the channel width direction and the vertical axis indicates the potential of the drift region DRI in the first surface FS.

In a case where the bottoms of the first insulation isolation film ISO1 and the second insulation isolation film ISO2 are located in the drift region DRI, a path through which electric current flows from the drain region DRA to the source region SR via the drift region DRI and the body region BR is secured also in a region where the first insulation isolation film ISO1 and the second insulation isolation film ISO2 are provided.

Therefore, in this case, it is possible to increase an amount of current flowing between the drain region DRA and the source region SR while improving the off-state breakdown voltage in the above-described region by depleting the part of the drain region DRA which is located between the first insulation isolation film ISO1 and the second insulation isolation film ISO2 owing to provision of the first buried part BP1, the second buried part BP2, the first cap part CA1 and the second cap part CA2. Accordingly, in this case, it is possible to improve a tradeoff relation between the off-state breakdown voltage and an on-resistance. That is, it is possible to improve the on-resistance while maintaining the off-state breakdown voltage or it is possible to improve the off-state breakdown voltage while maintaining the on-resistance.

Figure 17:
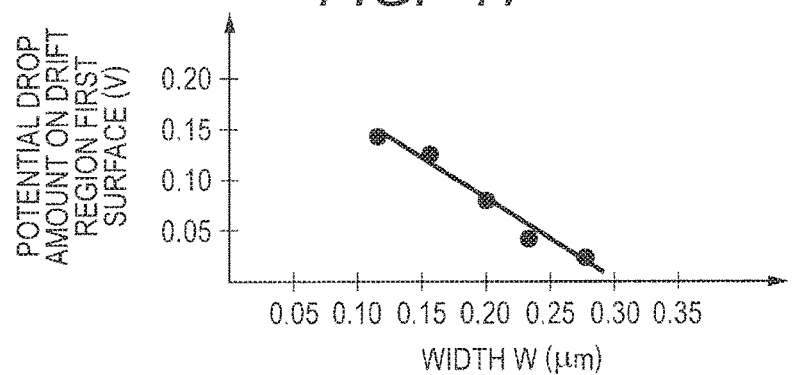
FIG. 17 is a graph illustrating one example of a relation between a width W and a reduction amount of the potential of the drift region which is sandwiched between the first insulation isolation film and the second insulation isolation film in the first surface in the semiconductor device according to the first embodiment.

As a result of performing another simulation by setting a difference in potential between the drift region DRI and the conductive film CL to 5V, when the width W is not more than 0.3 μm, relaxation of electric field concentration (depletion of the drift region DRI) occurs in the part of the drift region DRI which is sandwiched between the first insulation solation film ISO1 and the second insulation isolation film ISO2 in the first surface FS as illustrated in FIG. 17. The larger the difference in potential between the drift region DRI and the conductive film CL becomes, the more a depletion layer is enlarged. Therefore, in this case, it is possible to more improve the off-state breakdown voltage when the difference in potential between the drift region DRI and the conductive film CL is in a general range (for example, 20V).

Incidentally, in FIG. 17, the horizontal axis indicates the width W. In addition, in FIG. 17, the vertical axis indicates a reduction amount of the potential of the part of the drift region DRI which is sandwiched between the first insulation isolation film ISO1 and the second insulation isolation film ISO2 in the first surface FS owing to provision of the first buried part BP1, the second buried part BP2, the first cap part CA1 and the second cap part CA2.

Figure 18:
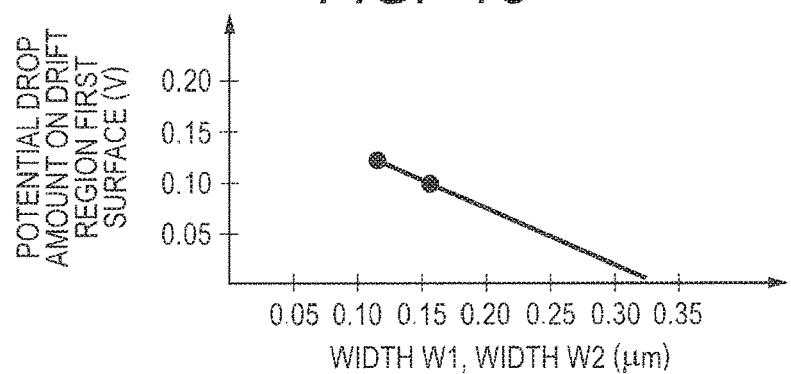
FIG. 18 is a graph illustrating one example of a relation between a width W1/a width W2 and the reduction amount of the potential of the drift region which is sandwiched between the first insulation isolation film and the second insulation isolation film in the first surface in the semiconductor device according to the first embodiment.

As a result of performing a further another simulation by setting the difference in potential between the drift region DRI and the conductive film CL to 5V, when the width W1 and the width W2 are not more than 0.3 μm, the relaxation of electric field concentration occurs in the part of the drift region DRI which is sandwiched between the first insulation solation film ISO1 and the second insulation isolation film ISO2 in the first surface FS as illustrated in FIG. 18. Therefore, in this case, it is possible to more improve the off-state breakdown voltage when the difference in potential between the drift region DRI and the conductive film CL is in the general range.

Incidentally, in FIG. 18, the horizontal axis indicates the width W1 and the width W2. In addition, in FIG. 18, the vertical axis indicates the reduction amount of the potential of the part of the drift region DRI which is sandwiched between the first insulation isolation film ISO1 and the second insulation isolation film ISO2 in the first surface FS owing to provision of the first buried part BP1, the second buried part BP2, the first cap part CA1 and the second cap part CA2.

Electric field concentration is liable to occur at the source-region-SR-side ends of the first insulation isolation film ISO1 and the second insulation isolation film ISO2. In a case where the drain-region-DRA-side end of the gate electrode GE is located closer to the source region SR than the source-region-SR-side ends of the first insulation isolation film ISO1 and the second insulation isolation film ISO2, it is possible to relax the electric field concentration. Therefore, in this case, it is possible to more improve the off-state breakdown voltage.

Second Embodiment

In the following, a configuration of a semiconductor device according to the second embodiment will be described. Incidentally, in the following, a point/points which is/are different from the point(s) in the configuration of the semiconductor device according to the first embodiment will be mainly described and duplicated description of the same points is not repeated.

The semiconductor device according to the second embodiment has the semiconductor substrate SUB, the first insulation isolation film ISO1, the second insulation isolation film ISO2, the conductive film CL and so forth. The semiconductor substrate SUB has the source region SR, the drain region DRA, the body contact region BCR, the drift region DRI and the body region BR. The conductive film CL has the first buried part BP1, the second buried part BP2, the first cap part CA1 and the second cap part CA2. The configuration of the semiconductor device according to the second embodiment is common to the configuration of the semiconductor device according to the first embodiment in regard to these points.

However, the configuration of the semiconductor device according to the second embodiment is different from the configuration of the semiconductor device according to the first embodiment in arrangement of the first insulation isolation film ISO1 and the second insulation isolation film ISO2.

Figure 19:
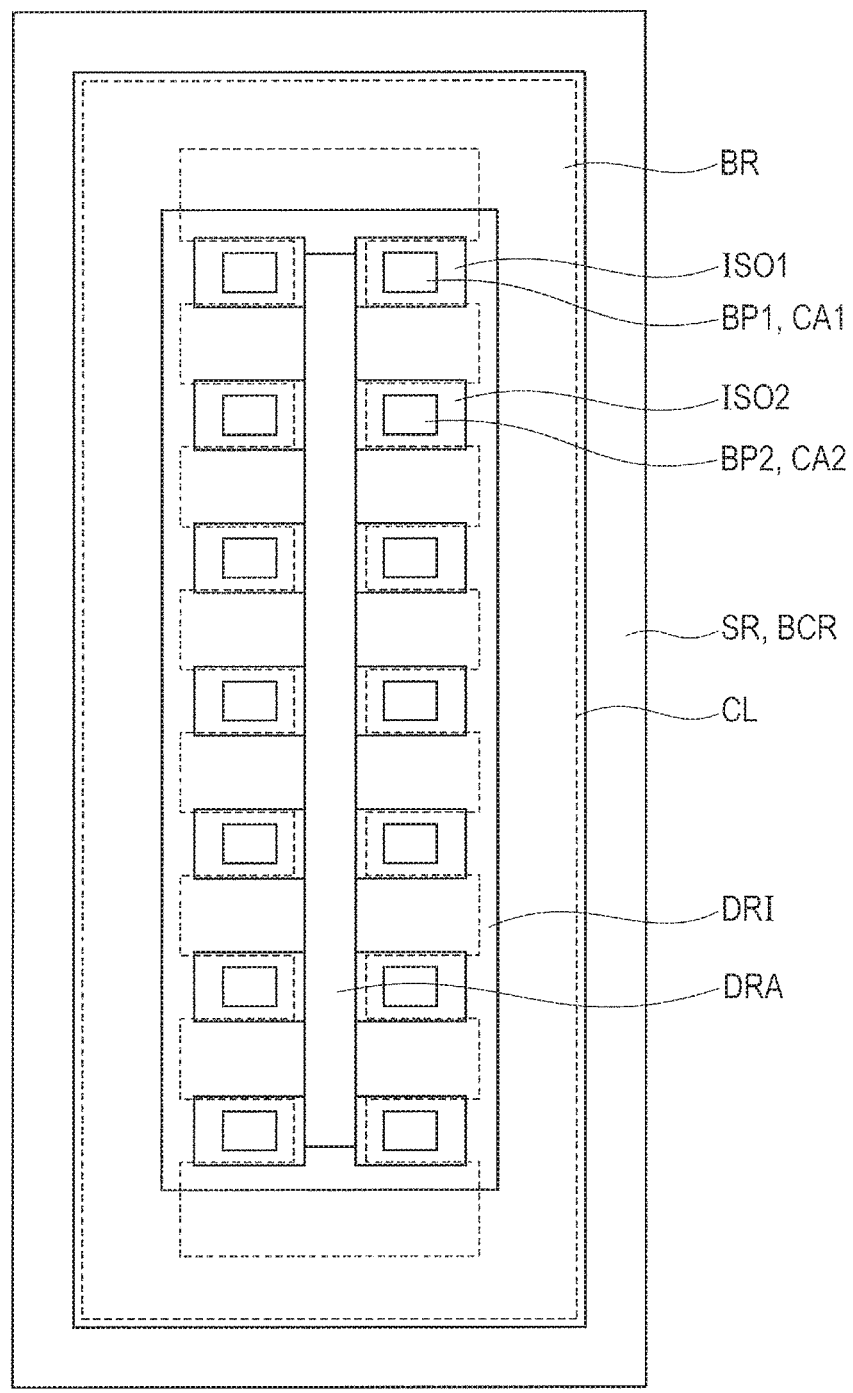
FIG. 19 is a top view illustrating one example of a semiconductor device according to a second embodiment.

As illustrated in FIG. 19, the drain region DRA extends along the channel width direction in the planar view. The first insulation isolation film ISO1 is located more outward than a channel-width-direction end of the drain region DRA. The second insulation isolation film ISO2 is located more inward than the channel-width-direction end of the drain region DRA.

A manufacturing method for the semiconductor device according to the second embodiment is the same as the manufacturing method for the semiconductor device according to the first embodiment.

In the following, an effect of the semiconductor device according to the second embodiment will be described. Incidentally, in the following, a point/points which is/are different from the point(s) in the effect of the semiconductor device according to the first embodiment will be mainly described and duplicated description of the same points is not repeated.

In a case where the drift region DRI which is not sandwiched between the first insulation isolation film ISO1 and the second insulation isolation film ISO2 is present, the relaxation of electric field concentration is performed only from one of the first insulation isolation film ISO1 and the second insulation isolation film ISO2 in the drift region DRI (the depletion layer is not enlarged).

On the other hand, in a case where the first insulation isolation film ISO1 is located more outward than the channel-width-direction end of the drain region DRA and the second insulation isolation film ISO2 is located more inward than the channel-width-direction end of the drain region DRA, the drift region DRI which is not sandwiched between the first insulation isolation film ISO1 and the second insulation isolation film ISO2 is not present. That is, it means that the relaxation of electric field concentration is performed on the drift region DRI from the both sides typically in the channel width direction. Therefore, according to the semiconductor device pertaining to the second embodiment, it is possible to more improve the off-state breakdown voltage.

Third Embodiment

In the following, a configuration of a semiconductor device according to the third embodiment will be described.

Incidentally, in the following, a point/points which is/are different from the point(s) in the configuration of the semiconductor device according to the first will be mainly described and duplicated description of the same points is not repeated.

The semiconductor device according to the third embodiment has the semiconductor substrate SUB, the first insulation isolation film ISO1, the conductive film CL and so forth. The semiconductor device according to the third embodiment may further have the second insulation isolation film ISO2. The semiconductor substrate SUB has the source region SR, the drain region DRA, the body contact region BCR, the drift region DRI and the body region BR. The conductive film CL has the first buried part BP1 and the first cap part CA1. The conductive film CL may further have the second buried part BP2 and the second cap part CA2. The configuration of the semiconductor device according to the third embodiment is common to the configuration of the semiconductor device according to the first embodiment in regard to these points.

Figure 20:
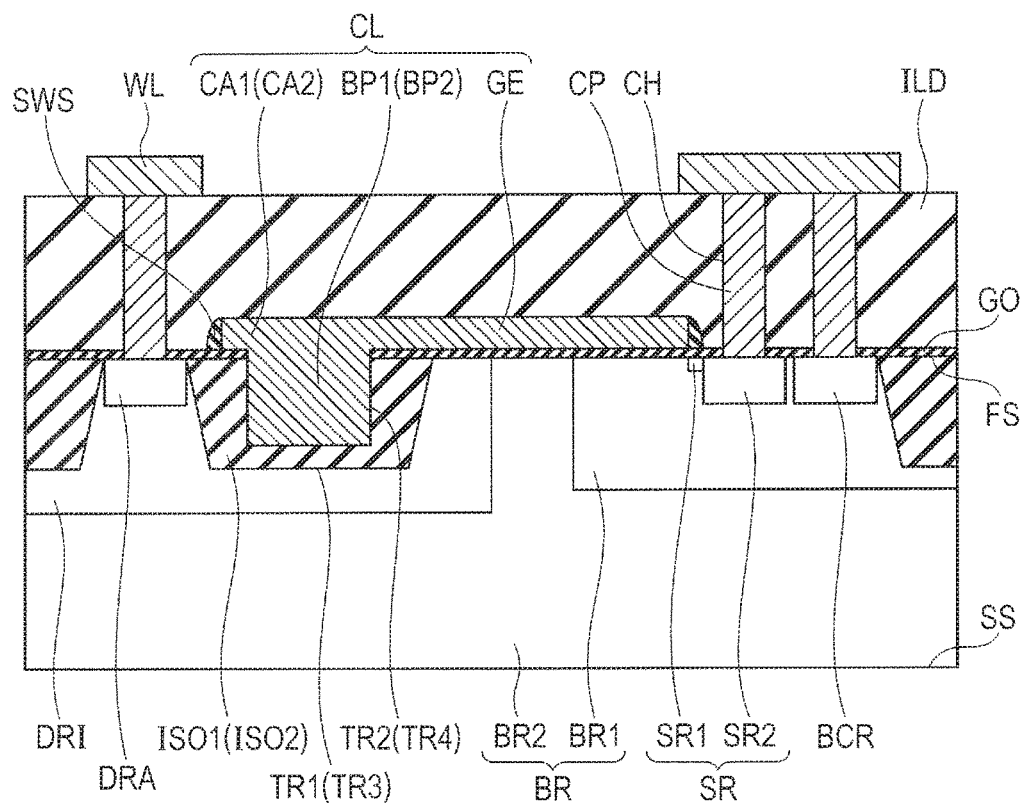
FIG. 20 is a sectional diagram illustrating one example of a region where an insulation isolation film of a semiconductor device according to a third embodiment is formed.

However, the configuration of the semiconductor device according to the third embodiment is different from the configuration of the semiconductor device according to the first embodiment in details of the first cap part CA1 and the second cap part CA2. More specifically, as illustrated in FIG. 20, an upper surface of the first cap part CA1 which is located on/over the trench TR2 and an upper surface of the second cap part CA2 which is located on/over the trench TR4 are flat.

In the following, a manufacturing method for the semiconductor device according to the third embodiment will be described. Incidentally, in the following, a point/points which is/are different from the point(s) in the manufacturing method for the semiconductor device according to the first embodiment will be mainly described and duplicated description of the same points is not repeated.

The manufacturing method for the semiconductor device according to the third embodiment has the front-end process S1 and the back-end process S2. The front-end process S1 has the first implantation process S11, the insulation isolation film formation process S12, the gate insulating film formation process S13, the conductive film formation process S14, the second implantation process S15, the sidewall spacer formation process S16 and the third implantation process S17. The back-end process S2 has the interlayer insulating film formation process S21, the contact plug formation process S22 and the wiring formation process S2. The manufacturing method for the semiconductor substrate according to the third embodiment is common to the manufacturing method for the semiconductor device according to the first embodiment in regard to these points.

However, the manufacturing method for the semiconductor device according to the third embodiment is different from the manufacturing method for the semiconductor device according to the first embodiment in details of the conductive film formation process S14.

In formation of the conductive film CL, firstly, formation of the trench TR2 and the trench TR4 is performed. Formation of the trench TR1 and the trench TR2 is performed by, for example, isotropic etching such as the RIE and so forth using the photoresist as the mask.

In formation of the conductive film CL, secondly, film-formation of a material which configures the conductive film CL is performed. Film-formation of the material which configures the conductive film CL is performed by, for example, the CVD and the forth. Thereby, the material which configures the conductive film CL is film-formed on/over the gate insulating film GO, on/over the first insulation isolation film SO1 and the second insulation isolation film SO2 and in the trench TR2 and the trench TR4.

Figure 21:
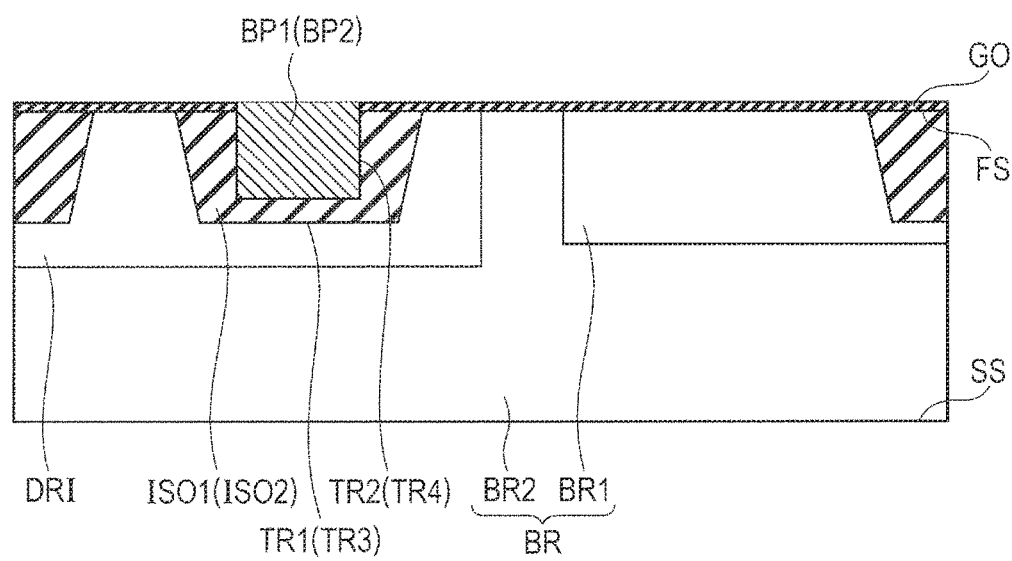
FIG. 21 is a sectional diagram illustrating one example of the region where the insulation isolation film of the semiconductor device according to the third embodiment is formed at a third step of a conductive film formation process.

In formation of the conductive film CL, as illustrated in FIG. 21, thirdly, in the material which configures the conductive film CL, parts other than parts which are buried in the trench TR2 and the trench TR4 are removed. This removal is performed by, for example, etch back. Thereby, the first buried part BP1 and the second buried part BP2 are formed.

In formation of the conductive film CL, fourthly, film-formation of the material which configures the conductive film CL is performed again. In formation of the conductive film CL, fifthly, patterning of the material which configures the film-formed conductive film CL is performed. Patterning of the material which configures the film-formed conductive film CL is performed by, for example, photolithography and etching. Thereby, the gate electrode GE, the first cap part CA1 and the second cap part CA2 are formed.

That is, in the manufacturing method for the semiconductor device according to the third embodiment, the first cap part CA1, the second cap part CA2 and the gate electrode GE are formed after burying the first buried part BP1 and the second buried part BP2 into the trench TR2 and the trench TR4 respectively. Consequently, in the semiconductor device according to the third embodiment, the upper surface of the first cap part CA1 which is located on the trench TR2 and the upper surface of the second cap part CA2 which is located on the trench TR4 are made flat.

In the following, an effect of the semiconductor device according to the third embodiment will be described. Incidentally, in the following, a point/points which is/are different from the point(s) in the effect of the semiconductor device according to the firs embodiment will be mainly described and duplicated description of the same points is not repeated.

In a case where the upper surface of the first cap part CA1 which is located on the trench TR2 and the upper surface of the second cap part CA2 which is located on the trench TR4 are not flat (depressions are formed in the upper surface of the first cap part CA1 which is located on the trench TR2 and the upper surface of the second cap part CA2 which is located on the trench TR4), there is the possibility that photoresist residues and so forth may remain in the depressions.

On the other hand, in the semiconductor device according to the third embodiment, since the upper surface of the first cap part CA1 which is located on the trench TR2 and the upper surface of the second cap part CA2 which is located on the trench TR4 are flat (the upper surface of the first cap part CA1 which is located on the trench TR2 and the upper surface of the second cap part CA2 which is located on the trench TR4 are not depressed), it is possible to suppress generation of such residues and so forth.

Fourth Embodiment

In the following, a configuration of a semiconductor device according to the fourth embodiment will be described. Incidentally, in the following, a point/points which is/are different from the point(s) in the configuration of the semiconductor device according to the first embodiment will be mainly described and duplicated description of the same points is not repeated.

The semiconductor device according to the fourth embodiment has the semiconductor substrate SUB, the first insulation isolation film ISO1, the second insulation isolation film ISO2, the conductive film CL and so forth. The semiconductor substrate SUB has the source region SR, the drain region DRA, the body contact region BCR, the drift region DRI and the body region BR. The conductive film CL has the first buried part BP1, the second buried part BP2, the first cap part CA1 and the second cap part CA2. The configuration of the semiconductor device according to the fourth embodiment is common to the configuration of the semiconductor device according to the first embodiment in regard to these points.

Figure 22:
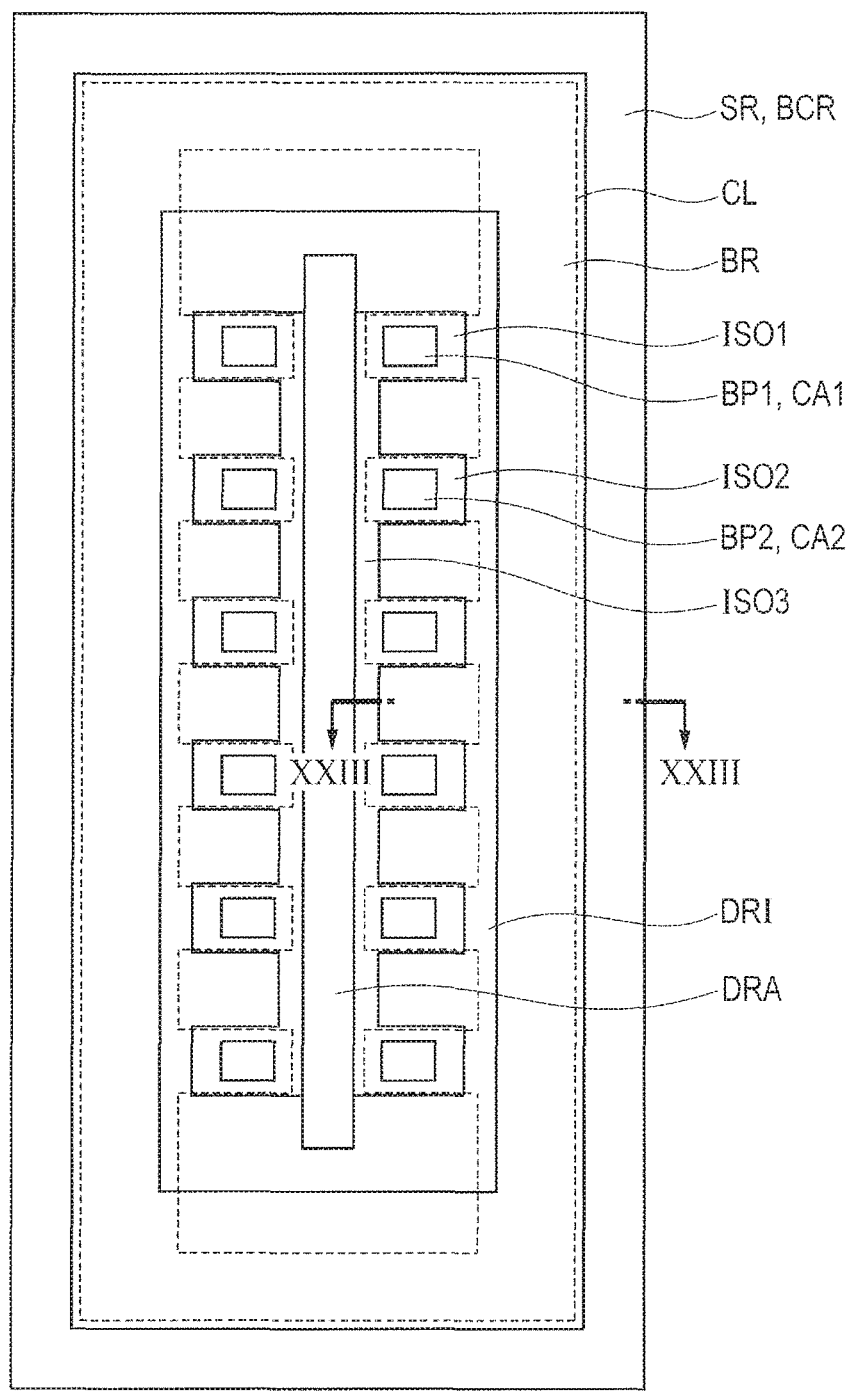
FIG. 22 is a top view illustrating one example of a semiconductor device according to a fourth embodiment.

However, the configuration of the semiconductor device according to the fourth embodiment is different from the configuration of the semiconductor device according to the first embodiment in the point that the semiconductor device according to the fourth embodiment further has a third insulation isolation film IS03 as illustrated in FIG. 22.

Figure 23:
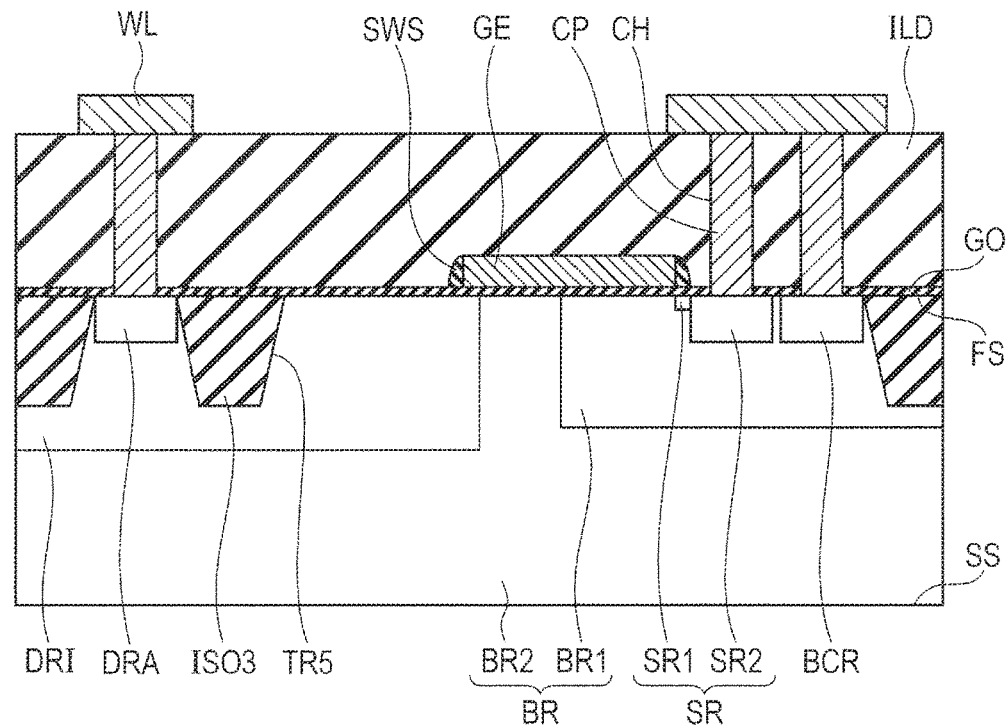
FIG. 23 is a sectional diagram along XXIII-XXIII in FIG. 22.

As illustrated in FIG. 23, the third insulation isolation film IS03 is arranged in the first surface FS. More specifically, a trench TR5 which extends in a direction toward the second surface SS is arranged in the first surface FS. The third insulation isolation film ISO3 is buried in the trench TR5. The third insulation isolation film ISO3 is arranged between the first insulation isolation film ISO1 and the second insulation isolation film ISO2. Preferably, the third insulation isolation film ISO3 is formed integrally with the first insulation isolation film ISO1 and the second insulation isolation film ISO2.

It is preferable that a source-region-SR-side end of the third insulation isolation film ISO3 be located closer to the drain region DRA side than the source-region-SR-side ends of the first insulation isolation film ISO1 and the second insulation isolation film ISO2. It is preferable that a bottom of the third insulation isolation film ISO3 be located in the drift region DRI. Preferably, the third insulation isolation film ISO3 is made of the material which is the same as the material of the first insulation isolation film ISO1 and the second insulation isolation film ISO2. That is, the third insulation isolation film ISO3 is made of, for example, $SiO_2$.

A manufacturing method for the semiconductor device according to the fourth embodiment has the front-end process S1 and the back-end process S2. The front-end process S1 has the first implantation process S11, the insulation isolation film formation process S12, the gate insulating film formation process S13, the conductive film formation process S14, the second implantation process S15, the sidewall spacer formation process S16 and the third implantation process S17. The back-end process S2 has the interlayer insulating film formation process S21, the contact plug formation process S22 and the wiring formation process S2. The manufacturing method for the semiconductor substrate according to the fourth embodiment is common to the manufacturing method for the semiconductor device according to the first embodiment in regard to these points.

However, the manufacturing method for the semiconductor device according to the fourth embodiment is different from the manufacturing method for the semiconductor device according to the first embodiment in details of the insulation isolation film formation process S12.

Figure 24:
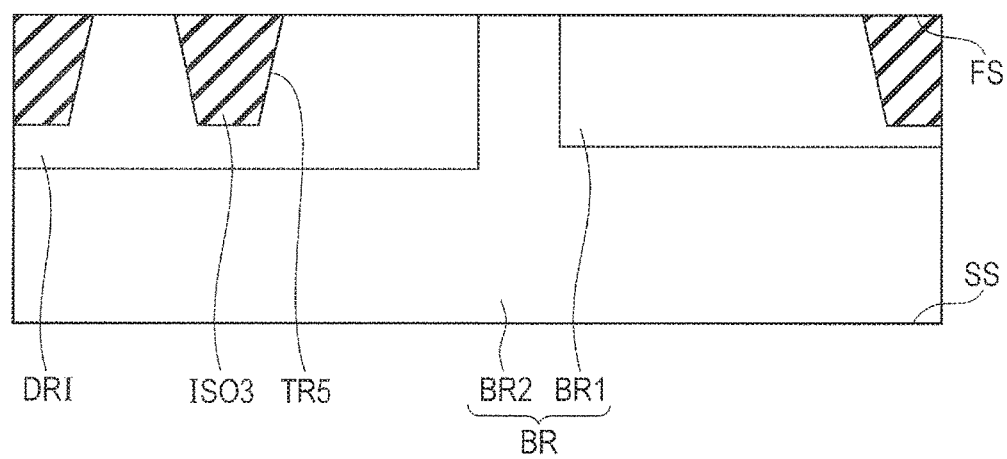
FIG. 24 is a sectional diagram illustrating one example of a region where a third insulation isolation film of the semiconductor device according to the fourth embodiment is formed in the interlayer insulating film formation process.

In the insulation isolation formation process S12, formation of the third insulation isolation film ISO3 is performed in addition to formation of the first insulation isolation film ISO1 and the second insulation isolation film ISO2 as illustrated in FIG. 24. In formation of the third insulation isolation film ISO3, firstly, formation of the trench TR5 is performed. Formation of the trench TR5 is performed by, for example, isotropic etching such as the RIE and so forth.

Incidentally, it is preferable that formation of the trench TR5 be performed simultaneously with formation of the trench TR1 and the trench TR2.

In formation of the third insulation isolation film ISO3, secondly, burying of a material which configures the third insulation isolation film ISO3 into the trench TR5 is performed. This burying is performed by depositing the material which configures the third insulation isolation film ISO3 onto the first surface FS by, for example, the CVD and so forth and removing the material which configures the third insulation isolation film ISO3 and protrudes from the trench TR5 is removed by, for example, the CMP and so forth. Incidentally, it is preferable that burying of the material which configures the third insulation isolation film ISO3 into the trench TR5 be performed simultaneously with burying of the material which configures the first insulation isolation film ISO1 and the second insulation isolation film ISO2 into the trench TR1 and the trench TR2.

In the following, an effect of the semiconductor device according to the fourth embodiment will be described. In the following, a point/points which is/are different from the point(s) in the effect of the semiconductor device according to the first embodiment will be mainly described and duplicated description of the same points is not repeated.

In the semiconductor device according to the fourth embodiment, since the third insulation isolation film ISO3 is arranged between the first insulation isolation film ISO1 and the second insulation isolation film ISO2, it is possible to more improve the off-state breakdown voltage of the part of the drift region DRI which is sandwiched between the first insulation isolation film ISO1 and the second insulation isolation film ISO2.

Although the invention made by the inventors concerned is specifically described on the basis of the embodiments as mentioned above, it goes without saying that the present invention is not limited to the above-described embodiments and may be modified and altered in a variety of ways within the range not deviating from the gist of the present invention.

What is claimed is:

1. A semiconductor device comprising:
   a semiconductor substrate having a first surface and a second surface which is a surface opposite to the first surface;
   a first insulation isolation film which is arranged in the first surface and in which a first trench which extends in a direction toward the second surface is formed; and
   a conductive film having a gate electrode, a first buried part which is buried in the first trench and a first cap part which is located over the first buried part,
   wherein the semiconductor substrate has a source region of a first conductivity type which is arranged in the first surface, a drain region of the first conductivity type which is arranged in the first surface separately from the source region, a drift region of the first conductivity type which is arranged in the first surface so as to surround the drain region and a body region of a second conductivity type which is a conductivity type opposite to the first conductivity type which is arranged in the first surface so as to be sandwiched between the drift region and the source region and to surround the source region,
   wherein the gate electrode faces the body region which is sandwiched between the drift region and the source region while being insulated from the body region, and
   wherein the first cap part projects from the first buried part in a channel width direction which is a direction along a boundary between the body region and the drift region in a planar view over the first insulation isolation film.

2. The semiconductor device according to claim 1 further comprising:
   a second insulation isolation film which is arranged in the first surface and in which a second trench which extends in the direction toward the second surface is formed,
   wherein the gate electrode further has a second buried part which is buried in the second trench and a second cap part which is located over the second buried part,
   wherein a part of the drift region is sandwiched between the first insulation isolation film and the second insulation isolation film in the channel width direction, and
   wherein the second cap part projects from the second buried part in the channel width direction over the second insulation isolation film.

3. The semiconductor device according to claim 2 further comprising:
   a third insulation isolation film which is arranged in the first surface,
   wherein the third insulation isolation film is located between the first insulation isolation film and the second insulation isolation film in the channel width direction.

4. The semiconductor device according to claim 2,
   wherein bottoms of the first insulation isolation film and the second insulation isolation film are located in the drift region.

5. The semiconductor device according to claim 2,
   wherein upper surfaces of the first cap part which is located over the first trench and of the second cap part which is located over the second trench are flat.

6. The semiconductor device according to claim 2,
   wherein a maximum value of a thickness of the first insulation isolation film which is located between the drift region and the first buried part in the channel width direction is not more than 0.3 µm and a maximum value of a thickness of the second insulation isolation film which is located between the drift region and the second buried part in the channel width direction is not more than 0.3 µm.

7. The semiconductor device according to claim 2,
   wherein a minimum value of a width of the part of the drift region which is sandwiched between the first insulation isolation film and the second insulation isolation film in the channel width direction is not more than 0.3 µm.

8. The semiconductor device according to claim 2,
   wherein the first insulation isolation film is arranged more outward than an end of the drain region in the channel width direction, and
   wherein the second insulation isolation film is arranged more inward than the end of the drain region.

9. The semiconductor device according to claim 2,
   wherein a drain-region-side end of the gate electrode is arranged closer to the source region side than source-region-side ends of the first insulation isolation film and the second insulation isolation film.

* * * * *